US010224475B2

(12) United States Patent
Cybart et al.

(10) Patent No.: US 10,224,475 B2
(45) Date of Patent: Mar. 5, 2019

(54) METHOD FOR FABRICATING SUPERCONDUCTING DEVICES USING A FOCUSED ION BEAM

(71) Applicant: THE REGENTS OF THE UNIVERSITY OF CALIFORNIA, Oakland, CA (US)

(72) Inventors: Shane A. Cybart, San Diego, CA (US); Ethan Y. Cho, San Diego, CA (US); Robert C. Dynes, La Jolla, CA (US); Travis J. Wong, San Diego, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 15/317,101

(22) PCT Filed: Jun. 11, 2015

(86) PCT No.: PCT/US2015/035426
§ 371 (c)(1),
(2) Date: Dec. 7, 2016

(87) PCT Pub. No.: WO2016/003626
PCT Pub. Date: Jan. 7, 2016

(65) Prior Publication Data
US 2017/0133577 A1     May 11, 2017

Related U.S. Application Data

(60) Provisional application No. 62/010,991, filed on Jun. 11, 2014.

(51) Int. Cl.
*G01R 33/035* (2006.01)
*H01L 39/24* (2006.01)
*H01L 27/18* (2006.01)

(52) U.S. Cl.
CPC .......... *H01L 39/2496* (2013.01); *H01L 27/18* (2013.01); *H01L 39/249* (2013.01); *H01L 39/2493* (2013.01)

(58) Field of Classification Search
CPC .............. H01L 39/249; H01L 39/2493; H01L 39/2496; H01L 27/18
See application file for complete search history.

(56) References Cited

U.S. PATENT DOCUMENTS

| 5,026,682 A | 6/1991 | Clark et al. |
| 5,053,383 A | 10/1991 | Short et al. |
| 5,109,164 A | 4/1992 | Matsui |

(Continued)

OTHER PUBLICATIONS

Bodea et al. "Modification and nano-patterning of high-TC superconducting thin films by masked ion beam radiation," 9th European Conference on Applied Superconductivity (EUCAS 09) IOP Publishing, Journal of Physics: Conference Series 234 (2010).

(Continued)

*Primary Examiner* — Paul A Wartalowicz
(74) *Attorney, Agent, or Firm* — Eleanor Musick; Musick Davison LLP

(57) ABSTRACT

Nano-scale junctions, wires, and junction arrays are created by using a focused high-energy ion beam to direct-write insulating or poorly conducting barriers into thin films of materials that are sensitive to disorder, including superconductors, ferromagnetic materials and semiconductors.

23 Claims, 26 Drawing Sheets

(56) References Cited

U.S. PATENT DOCUMENTS

| | | |
|---|---|---|
| 5,229,361 A | 7/1993 | Shiraishi et al. |
| 5,411,937 A | 5/1995 | Wendt et al. |
| 5,416,072 A | 5/1995 | Inada et al. |
| 5,550,101 A | 8/1996 | Nagata et al. |
| 5,801,393 A | 9/1998 | Sung et al. |
| 5,849,669 A | 12/1998 | Wen |
| 6,924,493 B1 | 8/2005 | Leung |
| 6,982,240 B1 | 1/2006 | Clark et al. |
| 9,653,309 B2 | 5/2017 | Dynes et al. |
| 2004/0023434 A1 | 2/2004 | Venkatesan et al. |
| 2004/0145694 A1 | 7/2004 | Segawa et al. |
| 2004/0266627 A1 | 12/2004 | Moeckly et al. |
| 2008/0146449 A1 | 6/2008 | Lesueur et al. |
| 2010/0230814 A1 | 9/2010 | Marks et al. |
| 2011/0147609 A1 | 6/2011 | Shichi et al. |
| 2012/0199737 A1 | 8/2012 | Maas et al. |
| 2016/0149111 A1 | 5/2016 | Cybart et al. |

OTHER PUBLICATIONS

PCT/US2015/035426, International Search Report dated Dec. 29, 2015, 2 pages.

PCT/US2015/035426, Written Opinion dated Dec. 29, 2015, 9 pages.

Cho, E.Y., et al.; YBa2Cu3O7-δ superconducting quantum interference devices with metallic to insulating barriers written with a focused helium ion beam; Applied Physics Letters 106, 252691 (2015); 4 pages.

Cybart, S.A. et al., Very Large Scale Integration of Nanopatterned YBa2Cu3O7-δ Josephson Junctions in a Two-Dimentional Array; Nano Letters; 2009; vol. 9, No. 10; pp. 3581-3585.

Cybart, S.A. et al.; Comparison of measurements and simulations of series-parallel incommensurate area SQUID arrays fabricated from YBa2Cu3O7-δ ion damage Josephson junctions; J. Appl. Phys.; 2012; vol. 112(6); 6 pages.

Cybart, S.A. et al.; Nanometer scale high-aspect-ratio trench etching at controllable angles using ballistic reactive on etching; J. Vac. Sci. Technol. B; vol. 31(1), Jan./Feb. 2013; pp. 010604-1-010604-4.

Cybart, S.A. et al.; Temporal stability of Y—Ba—Cu—O nano Josephson junctions from ion irradiation; IEEE Trans. on Appl. Supercond.; 2013; vol. 23(3); 5 pages.

Cybart, S.A.; Nano Josephson superconducting tunnel junctions in YBa2Cu3O7-δ directly patterned with a focused helium ion beam; Nature Nanotechnology Letters; published online Apr. 27, 2015; DOI: 10.1038/NNANO.2015.76; 5 pages.

Harada, Y, et al.; Chapter: MgB2 SQUID for Magnetocardiography, found in "Superconductors—Properties, Technology, and Applications" by Grigorashvili, Y (Ed.), (c) Apr. 2012 by InTech; pp. 389-404.

Hong, Sung-Hak et al.; Fabrication of MgB2 nanobridge dc SQUIDs by focused ion beam; Physica C, Feb. 2010; pp. S1036-S1037.

Lang, W. et al.; Masked ion beam irradiation of high-temperature superconductors: patterning of nano-size regions with high point-defect density; Int. J. Nanotechnol., 2009, vol. 6, Nos. 7/8/ pp. 704-714.

Portesi, C. et al.; Fabrication of superconducting MgB2 nanostructures; Journal of Physics: Condensed Matter; vol. 20; 2008, 8 pages.

Roediger, Peter et al., Fabrication of Arrays of Nano-Superconducting Quantum Interference Devices Using a Double-Angle Processing Approach; IEEE Transactions on Applied Superconductivity; Jun. 23 vol. 23 No. 3; 4 pages.

Sidorkin, Vadim et al., Sub-10-nm nanolithography with a scanning helium beam; J. Vac. Sci. Technol. B, Jul./Aug. 2009/ vol. 27 No. 4; pp. L18-L20.

Wanzenboeck, H.D. et al., Focused Ion Beam Lithography; Ch. 2 of Recent Advances in Nanofabrication Techniques and Applications; Cui, Bo (Ed.) (c) Dec. 2011 by InTech; pp. 28-50.

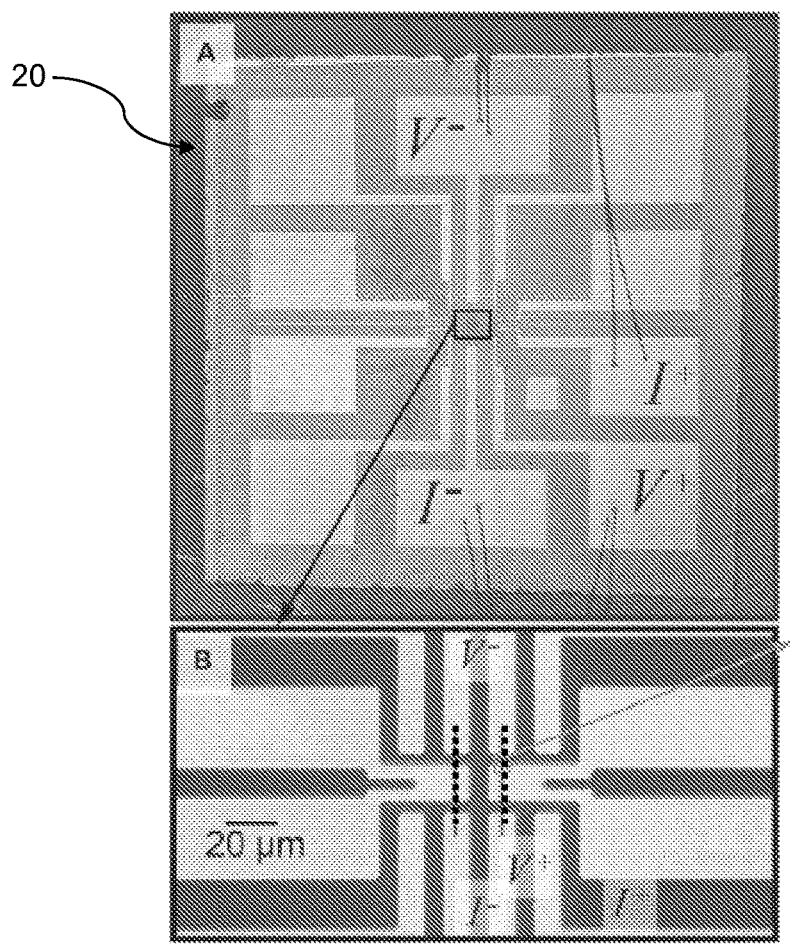
FIG. 3A
FIG. 3B
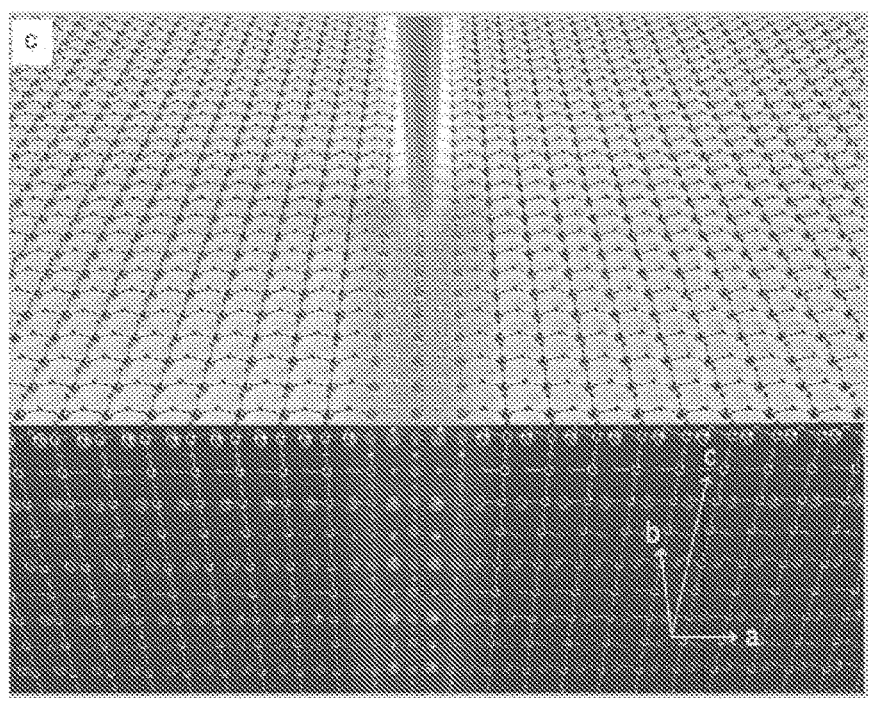
FIG. 3C

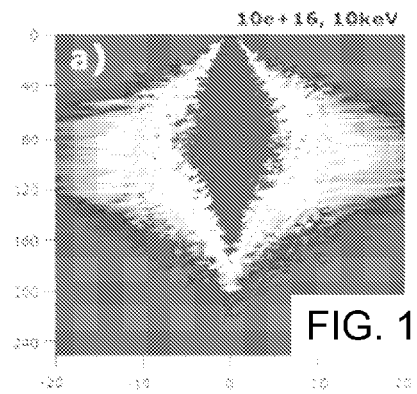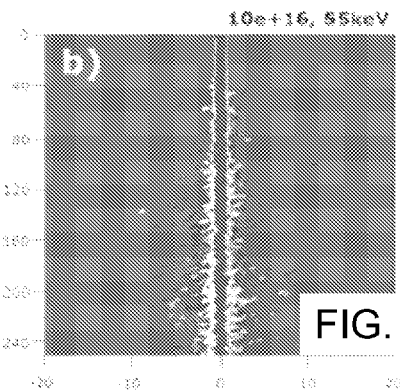
FIG. 15A   FIG. 15B
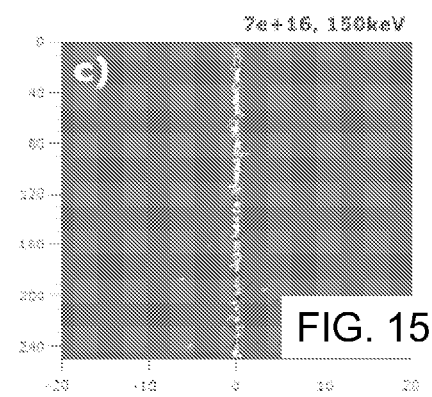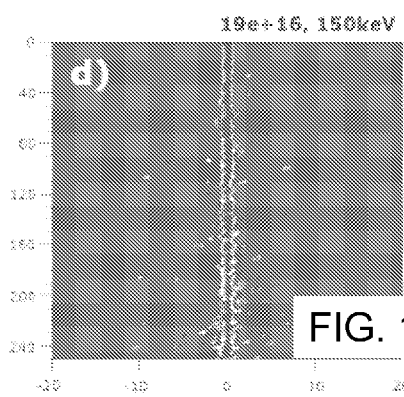
FIG. 15C   FIG. 15D
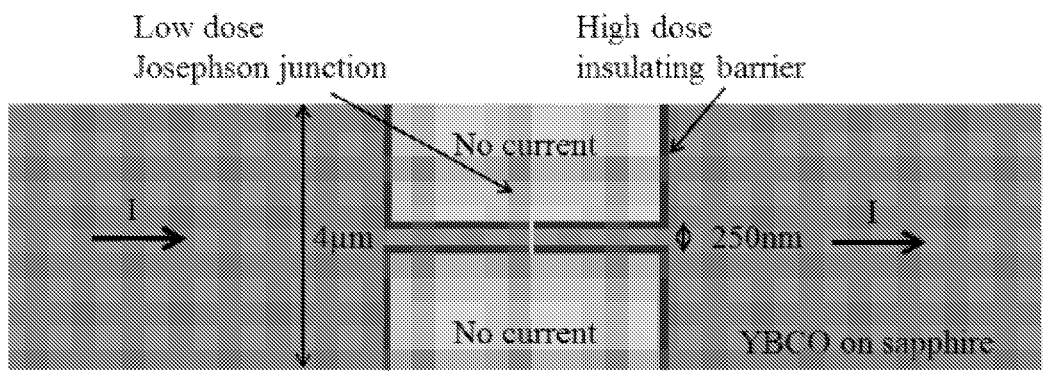
FIG. 16

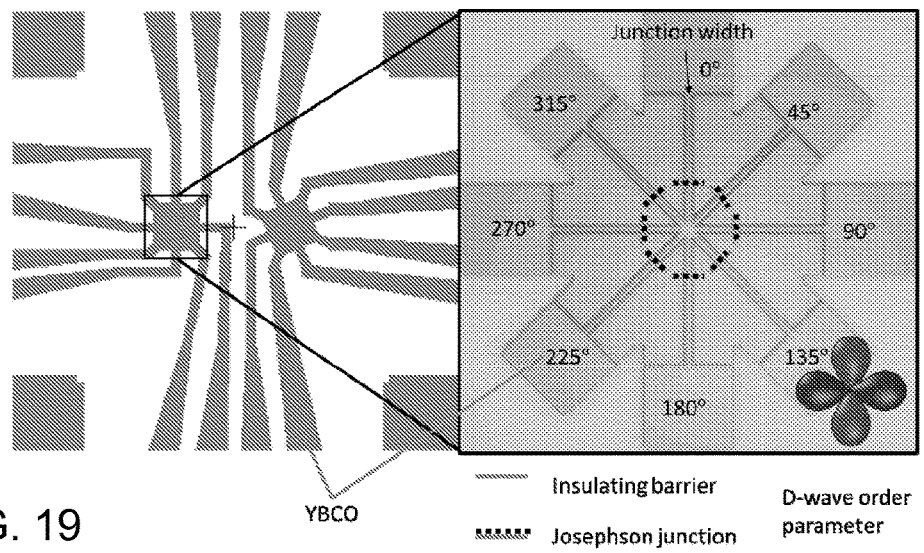
FIG. 19
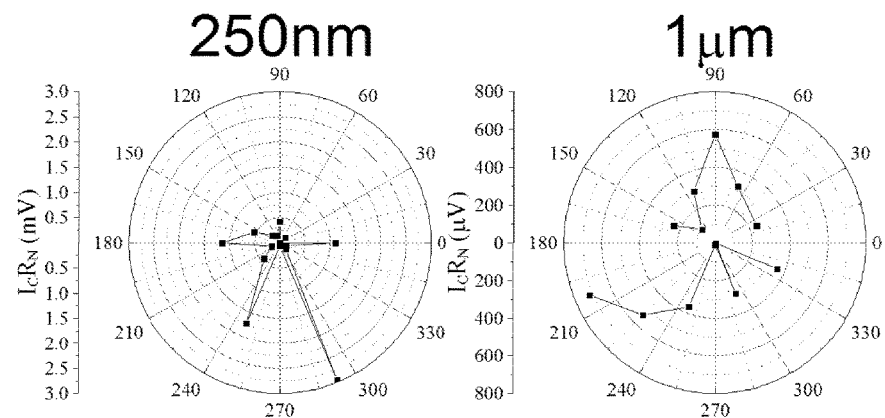
FIG. 20A
FIG. 20B
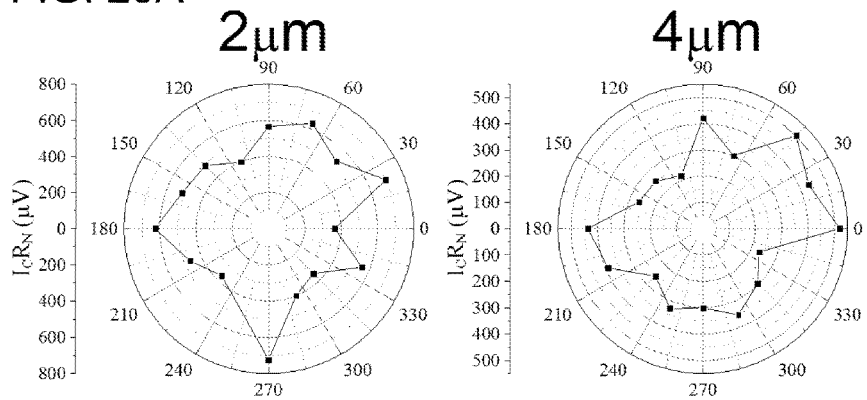
FIG. 20C
FIG. 20D

METHOD FOR FABRICATING SUPERCONDUCTING DEVICES USING A FOCUSED ION BEAM

RELATED APPLICATIONS

This application is a 371 national stage filing of International Application No. PCT/US2015/035426, filed Jun. 11, 2015, which claims the benefit of the priority of U.S. Provisional Application No. 62/010,991, filed Jun. 11, 2014, each of which is incorporated herein by reference in its entirety.

GOVERNMENT RIGHTS

This invention was made with government support under Contract No. DEAC02 05CH11231 from the United States Department of Energy. The government has certain rights in the invention.

FIELD OF THE INVENTION

The present invention relates to superconducting devices and a method for fabricating such devices and more specifically to use of a sub-nanometer ion beam to reproducibly produce superconducting tunneling devices that can operate within the HTS realm.

BACKGROUND

Since the discovery of the high-transition-temperature superconductors (HTS), researchers have searched for a method to fabricate superconducting tunnel junctions from these materials for both superconducting electronics operating at the practical temperature of liquid nitrogen (~77 K) and for fundamental measurements essential for testing and guiding theories of these remarkable superconductors.

There are a variety of scientific and technological reasons why it would be significant to be able to fabricate large numbers of reproducible, high-quality Josephson junctions from high-transition-temperature superconductors (HTS). Tunnel junctions would allow the spectroscopic study of HTS materials in the a-b plane allowing access to direct symmetry and excitation spectroscopies. Large scale circuits with millions of Josephson junctions on a chip could open new applications in high-performance computing, high-frequency sensors, and magnetometry that have been previously unsuccessful. A challenge associated with reaching these goals is that HTS materials are difficult to process and the superconducting coherence length is both short and anisotropic, typically ~2 nm in the a-b plane and ~0.2 nm along the c-axis. The coherence volume encloses very few superconducting pairs, so even the presence of small scale inhomogeneities can disrupt superconductivity. As a result, the electrical properties of Josephson junctions are sensitive to chemical changes and structural defects on atomic length scales. Consequently, to make multiple uniform HTS junctions, control at the atomic level is required.

HTS materials also exhibit highly anisotropic electrical transport. Conductivity along the c-axis is several orders of magnitude lower than that in the a-b plane. This further complicates device fabrication because the highest quality HTS films have c-axes oriented normal to the substrate. This complicates the possibility of growing epitaxial multi-layers to form sandwich-type junctions such as those created from conventional superconductors like niobium. In spite of these difficulties a number of fabrication techniques for junctions with excellent electrical properties have emerged, such as grain boundary, step-edge, and ramp-edge Josephson junctions. Unfortunately, these junctions have poor uniformity, limited scalability, and can only be made on small substrates. In addition, device fabrication is neither widely uniform nor predictable, and is more of an art-form than a manufacturable process.

Furthermore, historically, typical HTS Josephson junctions exhibit superconductor-normal metal-superconductor (SNS) properties and superconductor-insulator-superconductor (SIS) tunneling in an all HTS junction has only been observed in mechanical break junctions, some grain boundary junctions, and multi-layer c-axis sandwich junctions. These types of studies have provided a great deal of insight to theorists working on HTS. However, reproducibly fabricated tunnel junctions with well-defined interfaces, where the direction of transport can be controlled, would provide much more valuable information about the symmetry, pair wave function, and excitation spectrum. Tunneling spectroscopy has conventionally provided details about the density of excitations, the superconducting energy gap, and the coupling mechanism in conventional superconductors (electron-phonon in conventional superconductors). This information was essential to the formulation and testing of the BCS theory of superconductivity and strong coupling effects for low temperature superconductors. Some information has been obtained from the aforementioned methods, as well as from point contacts, normal metal-insulator-superconductor junctions, scanning probe microscopy, and SIS junctions between YBCO and conventional superconductors like Pb. However, a complete set of tunneling spectroscopy measurements in various symmetry directions on a length scale of the superconducting coherence length could provide more insight into the physics of the unconventional superconducting order parameters associated with HTS.

Both electron beam irradiation and masked ion implantation have long been used as methods to fabricate Josephson SNS junctions, but these junctions have suffered from very small characteristic voltages $V_C = I_C R_N$ (a figure of merit for Josephson junctions equal to the product of the critical current and the normal state resistance) that precludes their use in most applications. $I_C R_N$ is small for these earlier SNS junctions, because the irradiated Josephson junctions are larger than the superconducting coherence length. The typical width of the trenches used in the high-aspect-ratio masks used for defining these barriers is ~25 nm however lateral straggle of defects from the implantation process broadens out the barrier so that the actual length of the irradiated region can approach 100 nm. Josephson currents can only propagate through such large regions via the superconducting proximity effect, a phenomenon in which non-superconducting materials in close electrical proximity with a superconductor become superconducting themselves. In the case of ion irradiated Josephson junctions, the coupled materials are the same, but the irradiated region has a reduced transition temperature $T'_C$. If the irradiated region is narrow <100 nm it will sustain a Josephson current above $T'_C$ but the pair potential $\Delta$ is significantly reduced from that of the electrodes and this results in smaller values of $I_C R_N$.

Another drawback to these ion irradiated Josephson junctions is the presence of a large non-Josephson excess current at zero voltage that does not exhibit either the DC or AC Josephson effects. The physical origin of the excess current is understood in the framework of the Blonder, Tinkham, and Klapwijk model (BTK) for microscopic electrical transport at an interface between a superconductor and a normal material. The power of this model is that it can describe current-voltage characteristics for barriers ranging from a strong barrier, such as an insulator in a tunnel junction, to a weak barrier like a normal metal, using a single parameter related to barrier strength. In the case of a strong barrier the only transport mechanism for Cooper pairs is direct Josephson tunneling whereas with weaker barriers both tunneling and Andreev reflection occur. Therefore, to maximize the Josephson current and reduce excess current a strong barrier is required but it must also be confined to less than a few nanometers wide in order for tunneling to occur as the tunneling probability depends exponentially on the insulator thickness. This dimension is too challenging for most nanofabrication techniques such as electron beam lithography or gallium focused ion beams, which were not capable of creating a narrow (~1 nm) and strong barrier.

Accordingly, the need remains for a method for fabricating Josephson junctions and other devices with nanometer-scale dimensions. The present invention is directed to such a method.

BRIEF SUMMARY OF THE INVENTION

In an exemplary embodiment, high-quality all-HTS Josephson superconducting tunnel junctions, arrays and superconducting quantum interference devices (SQUIDs) can be created by using a sub-nanometer focused beam of ions to direct-write insulating barriers into superconducting thin films such as $YBa_2Cu_3O_{7-\delta}$ (YBCO). In some embodiments, a focused helium ion beam, with its diameter of around 500-pm, which is on the order of the tunneling length, allows the electrical transport properties of the Josephson barriers to be continuously tuned from metallic to insulating by merely increasing the ion fluence. In other embodiments, Josephson junctions may be fabricated in different superconducting films, including magnesium diboride, iron pnictides (e.g., Fe—As), or materials that are sensitive to disorder, such as multiferroics, graphene, manganites and semiconductors. Other ion beams with similar characteristics may be used, for example, focused silicon or beryllium ion beams, with beam diameters of 8 and 5 nm, respectively.

The inventive technique allows tuning of the junction characteristics and enables reproducible and scaled-up production of superconducting Josephson devices that can operate at easily-accessible temperatures, e.g., at or above 77 K. The invention has potential for far reaching impact on applications of superconducting electronics, from highly sensitive magnetometers for biomagnetic measurements of the human body, to large scale arrays for wideband satellite communications.

In one embodiment of the invention, a-b plane superconducting tunneling for both $YBa_2Cu_3O_{7-\delta}$ (YBCO) SIS and SNS junctions can be achieved by utilizing an approximately 500-pm diameter focused helium ion beam to create a very narrow (~nm) tunnel barrier between two superconducting electrodes. The key to this method is that YBCO is very sensitive to disorder and exhibits a superconductor-insulator transition for moderate levels of irradiation.

In one aspect of the invention, a method is provided for fabricating a superconducting device by patterning a circuit pattern comprising a plurality of bridges in a superconducting film; patterning a plurality of electrodes within the circuit pattern; and directing a focused energy beam having an energy level and a beam diameter onto selected regions of the superconducting film to produce a Josephson junction; wherein the superconducting film has a predetermined film thickness selected so that the energy beam travels through the entire predetermined film thickness without the beam diameter substantially increasing as a result of damage collisions. In one embodiment, the superconducting film is selected from the group consisting of YBCO, magnesium diboride ($MgB_2$), iron pnictides, and TIBCCO. The focused energy beam may be helium ion, silicon ion or beryllium ion beams, with diameters ranging from around 500 pm to about 8 nm. In a preferred embodiment, the energy beam is a helium ion beam having an energy level of 30 kV or more and the film thickness is 30 nm or less. The beam diameter is about 500 pm. Where the superconducting film has an initial thickness greater than the predetermined thickness, prior to the step of directing an energy beam, the superconducting film is ion milled to reduce the initial thickness to the predetermined film thickness. In some embodiments, the step of patterning a circuit pattern may include photolithographically generating a pattern on a layered film of a conductive metal on the superconducting film, and ion milling the conductive metal and the superconducting film. Alternatively, the step of patterning a circuit pattern may include directing a focused energy beam onto the superconducting film and using a high dose to drive the material insulating. In an exemplary embodiment, the Josephson junction has a width on the order of 1 nm.

In another aspect of the invention a method is provided for forming a Josephson junction, the method including: irradiating a bridge patterned in a superconducting film with a focused energy beam having a beam diameter and an energy level adapted to penetrate through a predetermined film thickness without substantial lateral straggle. The focused energy beam may be a ion beam having an energy level of approximately 30 kV or more and a beam diameter of approximately 500 pm. The ion beam may be helium ion beam, a silicon ion beam, a beryllium ion beam, or other focused ion beam capable of achieving the desired penetration without, or with minimal, lateral straggle. The beam diameter may be in the range of 500 pm to around 8 nm. The Josephson junction may have a width on the order of 1 nm or larger. The superconducting film may be YBCO with a film thickness of around 30 nm or less, or may be magnesium diboride ($MgB_2$), iron pnictides, TIBCCO, or other superconductors that are sensitive to disorder. In some embodiments, prior to irradiating, an initial film thickness is milled to reduce the superconducting film to the predetermined film thickness.

In still another aspect of the invention, a nanoscale high temperature superconducting device comprises a circuit pattern comprising a plurality of bridges defined in a superconducting film and having non-superconducting Josephson junctions formed therein, wherein the superconducting film has a film thickness adapted to permit an irradiating focused energy beam used to form the Josephson junctions to travel through the entire film thickness without the diameter of the energy beam substantially increasing as a result of damage collisions. In some embodiments, the superconducting material may be selected from the group consisting of YBCO, magnesium diboride ($MgB_2$), iron pnictides, and TIBCCO. The irradiating focused energy beam may be a helium ion beam having a diameter of approximately 500 pm. As an alternative to helium, a silicon ion beam, a beryllium ion beam, or other focused ion beam capable of achieving the desired penetration without, or with minimal, lateral straggle may be used. The focused ion beam may have an energy on the order of 30 kV and the film thickness is approximately 30 nm. In some embodiments, the Josephson junctions have widths on the order of 1 nm.

In still another aspect of the invention, a method for forming a nanoscale device in a film of material sensitive to disorder comprises irradiating a circuit pattern in the film with a focused energy beam having a beam diameter and an energy level adapted induce ion damage and penetrate through a predetermined film thickness without substantial lateral straggle. In some embodiments, the nanoscale device is one or more Josephson junctions, while in other embodiments, the nanoscale device is one or more nanowires. The material may be selected from the group consisting of superconductors, multiferroics, graphene, manganites and semiconductors. The focused energy beam may be helium ion, silicon ion or beryllium ion beams, with diameters ranging from around 500 pm to about 8 nm, or any other ion beam having a beam diameter in the same approximate range with energy levels capable of producing the desired level of ion damage. In certain embodiments, the energy beam has an energy level within a range of 30 kV to 200 kV and a beam diameter of about 500 pm. The circuit pattern may formed on a substrate using photolithography or direct writing with the focused energy beam. The initial thickness is preferably ion milled prior to irradiating the circuit pattern to reduce the initial thickness to the predetermined film thickness.

In order to achieve the desired performance and repeatability, the thickness of the superconducting film must be carefully controlled to be less than or equal to 30 nm so that uniform irradiated regions can be created. The irradiated Josephson junction regions are very narrow (about a nanometer, or less than the superconducting coherence length) and have electrical properties that differ greatly from those of wider regions. Ion fluences ranging between $10^{14}$ and $10^{18}$ He+/cm$^2$ were used. In between these two extremes, doses were determined to create very high-quality Josephson junctions and continuously transition, from "SNS" junctions to "SIS" Josephson tunnel junctions. The doses were delivered in a one-dimensional line rather than a two-dimensional area to avoid overlap of defects from lateral straggle and make the defect barrier as narrow as possible. These techniques lead to excellent junction uniformity and electrical properties, including significant expansion of the operating temperature window. Additional improvements can obtained (e.g., further increasing the figure of merit $I_C R_N$) by using higher energy beams to create even narrower barriers that will increase $I_C$ considerably. Currently, gas field helium ion sources are limited to ~30 kV because this is the optimum extraction energy, however a negative bias could be added to the substrate to effectively increase the irradiation energy. Higher energies would also allow use of thicker films which have higher critical currents and better magnetic screening capability.

The methods disclosed herein will be applicable to all other oxide HTSs and other superconductors, including magnesium diboride, iron pnictides (e.g., Fe—As), as well as materials that are sensitive to disorder, such as multiferroics, graphene, manganites and semiconductors.

BRIEF DESCRIPTION OF THE DRAWINGS

FIG. 3A is a photograph of a photolithographically-patterned Au/YBCO film on a 5 mm×5 mm sapphire substrate; FIG. 3B is a zoomed-in view of the central substrate region showing where the gold contact region and YBCO film were etched prior to junction fabrication. FIG. 3C is a diagrammatic perspective view the focused helium ion beam creating a Josephson junction in the YBCO film.

FIG. 7A shows dI/dV for the temperatures ranging from 70 to 6 K in 5 K increments; FIG. 7B (also inset in FIG. 7A) is a zoomed in view in the low bias regime around the super current; FIG. 7C (also inset in FIG. 7A) shows the temperature dependence of 2Δ and BCS fit; and FIG. 7D plots the I-V characteristic for high current measurements for a SIS Josephson junction showing the critical current of the electrodes and heating effects. The inset plots critical current as a function of temperature.

FIG. 9B (also inset in FIG. 9A) is an I-V curve measured with and without f=17.6 GHz radiation. A giant Shapiro step is observed at $$20 \times \frac{hf}{2e} = 0.727 \text{ mV};$$

FIG. 9C provides the I-V characteristics of a SIS junction array measured at 6 K; and FIG. 9D (also inset in FIG. 9C) shows expanded range I-V and dI/dV for the SIS junction array at 6 K.

FIG. 10B provides the I-V in the voltage range around the super-current and bias point; FIG. 10C (also inset in FIG. 10B) plots voltage as a function of magnetic field statically biased at 200 μA showing both quantum interference and diffraction; and FIG. 10D (also inset in FIG. 10B) is a zoomed view of the SQUID oscillations.

FIG. 11B shows a zoomed in region of FIG. 11A.

FIGS. 12A and 12B show the current-voltage characteristics of SIS and SNS SQUIDS at 4K and 50K, respectively. FIGS. 12C and 12D show the voltage-magnetic field characteristics of SIS and SNS SQUIDS, respectively, showing the voltage modulation at constant current bias. FIGS. 12E and 12F show the higher magnetic field range sweep showing the Fraunhofer pattern of the junctions for the SIS and SNS SQUIDS, respectively.

FIGS. 15A-15D illustrate simulation results for varying dose-energy pairs for helium ion beam irradiation of a 250 nm YBCO film.

FIG. 16 is a schematic diagram of a direct write nanowire fabricated using the inventive process.

FIG. 19 is a diagram of a pattern formed in YBCO to evaluate anisotropy of YBCO.

FIGS. 20A-20D are polar plots of $I_CR_N$ for different junction orientations of widths 250 nm, 1 μm, 2 μm, and 4 μm, respectively.

DETAILED DESCRIPTION OF EMBODIMENTS OF THE INVENTION

According to embodiments of the invention, high-quality all-HTS Josephson superconducting tunnel junctions, arrays and superconducting quantum interference devices can be created by using an approximately 500 pm diameter focused beam of ions to direct-write insulating or poorly conducting barriers into superconducting films. While examples described herein describe the use of a helium ion beam, other types of focused ion beams may be used, including, but not limited to silicon ion and beryllium ion beams, or any ion species capable of achieving the desired penetration without, or with minimal, lateral straggle.

The examples described herein use $YBa_2Cu_3O_{7-\delta}$ (YBCO) thin films, however any other superconducting material may also be processed in this way to form Josephson junctions and nanowires. This technique provides a reliable and reproducible pathway to conduct superconducting tunneling studies in HTS, as well as an avenue for the scaling up of quantum mechanical circuits operating at practical temperatures. In addition, the described method is applicable to virtually any electronic device that is based on formation of a tunnel junction in a material that is sensitive to disorder, for example magnetic tunnel junctions (multiferroic, manganite, graphene, etc.) for spintronic circuits, and semiconductor junctions. The inventive method enables the fabrication of junctions that are strong and narrow, avoiding the limitations of conventional proximity effect Josephson junctions, including small $I_CR_N$, large reduction in wave function amplitude, and lack of quasiparticle tunneling.

Figure 1:
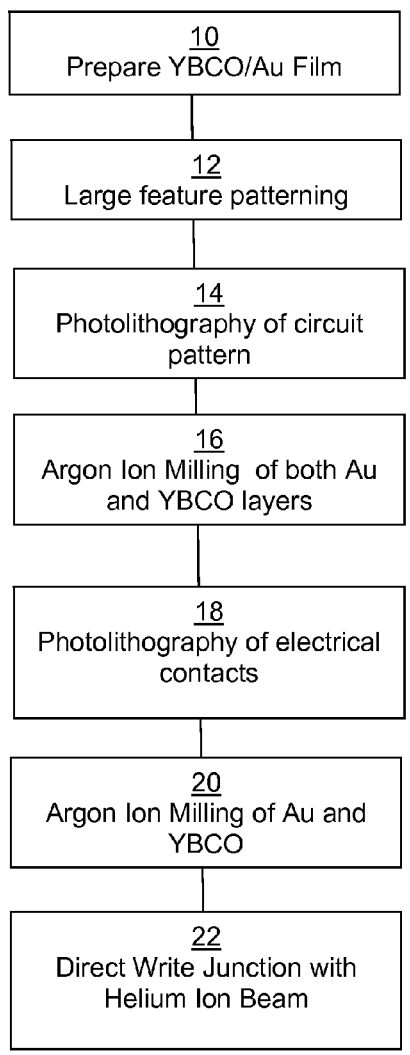
FIG. 1 provides a process flow according to one embodiment of the inventive process for fabrication of Josephson junctions.

The basic process flow for fabricating Josephson junctions is shown in FIG. 1. FIG. 3A provides a photo micrograph of an exemplary junction fabricated using the inventive process. To fabricate focused helium ion beam Josephson junctions, large circuit features for electrical contacts and 4-μm wide strips of YBCO were patterned using photolithography in a YBCO thin film on a 5 mm×5 mm sapphire substrate 20 that had an in situ deposited conductive contact layer on top. In the described example, gold (Au) is used, but selection of other conducting films, such as silver, palladium, platinum would be readily apparent to one of skill in the art. YBCO films 150 nm thick were grown using reactive coevaporation on cerium oxide buffered sapphire wafers. For electrical contacts, 200 nm of gold was sputtered onto the film before breaking vacuum (step 10). Wafers were diced into 5 mm×5 mm substrates and coated with a layer of OCG 825 G-line photoresist (Fujifilm Electronic Materials) per manufacturer's specifications. Using a contact mask aligner, the base structure was exposed and developed using OCG 934 developer (Fujifilm Electronic Materials) (step 12) in FIG. 1. This pattern (step 14) was transferred into both the gold and underlying YBCO film using DC argon ion milling (step 16). A second lithography (step 18) and ion milling step (step 20) were performed to selectively remove the gold contact layer, leaving the electrodes for connection to external conductors, and to reduce the thickness of the YBCO in the regions intended for junctions. Exposure to the focused He ion beam to induce ion damage for formation of the Josephson junction(s) is performed in step 22.

Figure 4A:
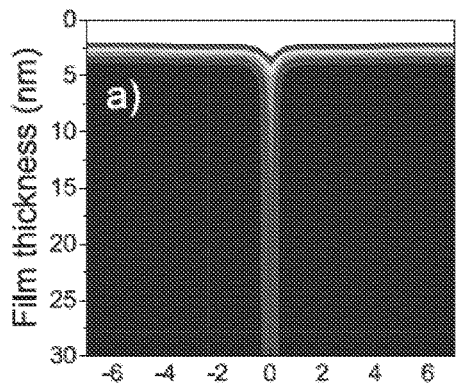
FIGS. 4A-4D are simulated results of various dose and energy combinations for determining helium ion penetration depth versus helium ion energy for superconducting YBCO films.
Figure 4B:
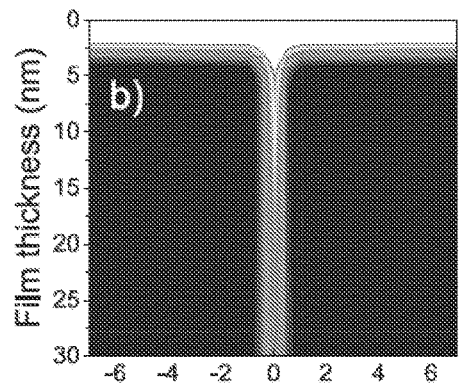
Figure 4C:
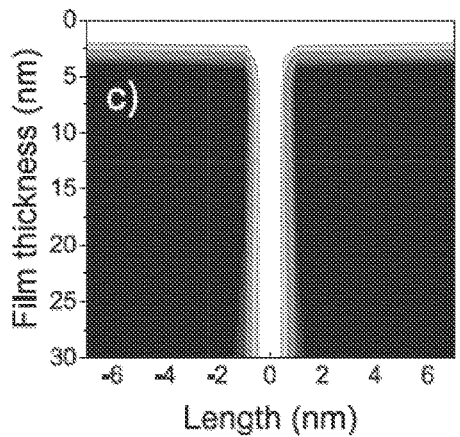
Figure 4D:
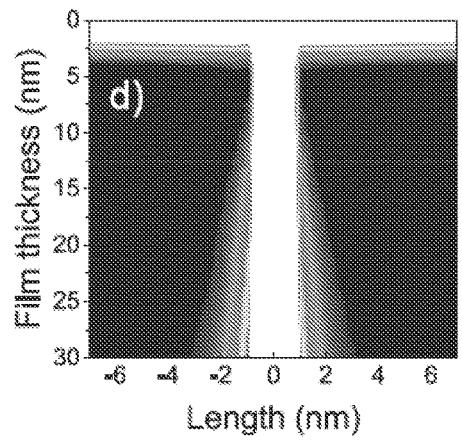

The initial YBCO film thickness was 150 nm, but the Au was removed and the YBCO was etched to a thickness of ~30 nm in the area intended for junctions. Reducing the thickness of the YBCO was determined to be essential to the success of this method because it was important that the He beam travel through the thickness of the film and not expand much in size as a result of the damage collisions. FIGS. 4A-4D provides the results of simulations run for 30 keV irradiation of YBCO film using binary collision approximation (BCA) in the ATHENA™ process simulation software from Silvaco, Inc. (Santa Clara, Calif.). In each of the simulations, 50,000,000 ion trajectories were used to simulate fluences of $1\times10^{16}$ ions/cm$^2$ (FIG. 4A), $2\times10^{16}$ ions/cm$^2$ (FIG. 4B), $6\times10^{16}$ ions/cm$^2$ (FIG. 4C), and $20\times10^{16}$ ions/cm$^2$ (FIG. 4D). These results indicated that the YBCO thickness should be less than or equal to 30 nm so that uniform irradiated regions could be created. In thicker films, given the available accelerating voltage of the system being used, lateral straggle begins to broaden the junction barriers resulting in undesirable properties such as excess current.

Figure 4E:
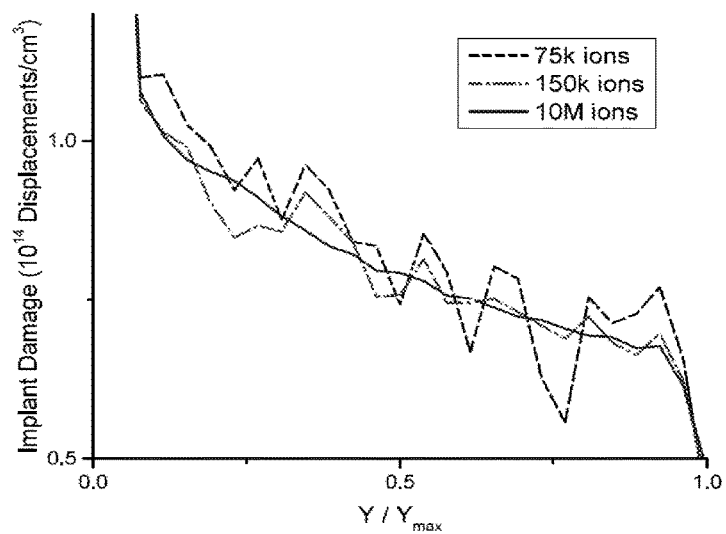
FIG. 4E is a plot of simulation results in YBCO for three different He+ ion doses at 30 keV.

Since it is not computationally efficient to attempt to simulate every single ion trajectory in the irradiation process, "pseudo-ions" are used, with each pseudo-ion representing several real ions. FIG. 4E is a plot of simulation results for irradiation of a 30 nm thick YBCO film using 30 keV He+ ions and with 75 k, 150 k and 10M pseudo-ions representing $2\times10^6$ real ions/cm$^2$. $Y/Y_{max}$ represents the normalized depth into the film with zero ("0") being the surface and "1" being 30 nm. As can be seen from the graph, a higher number of pseudo-ions yields a more uniform damage profile.

Figure 5A:
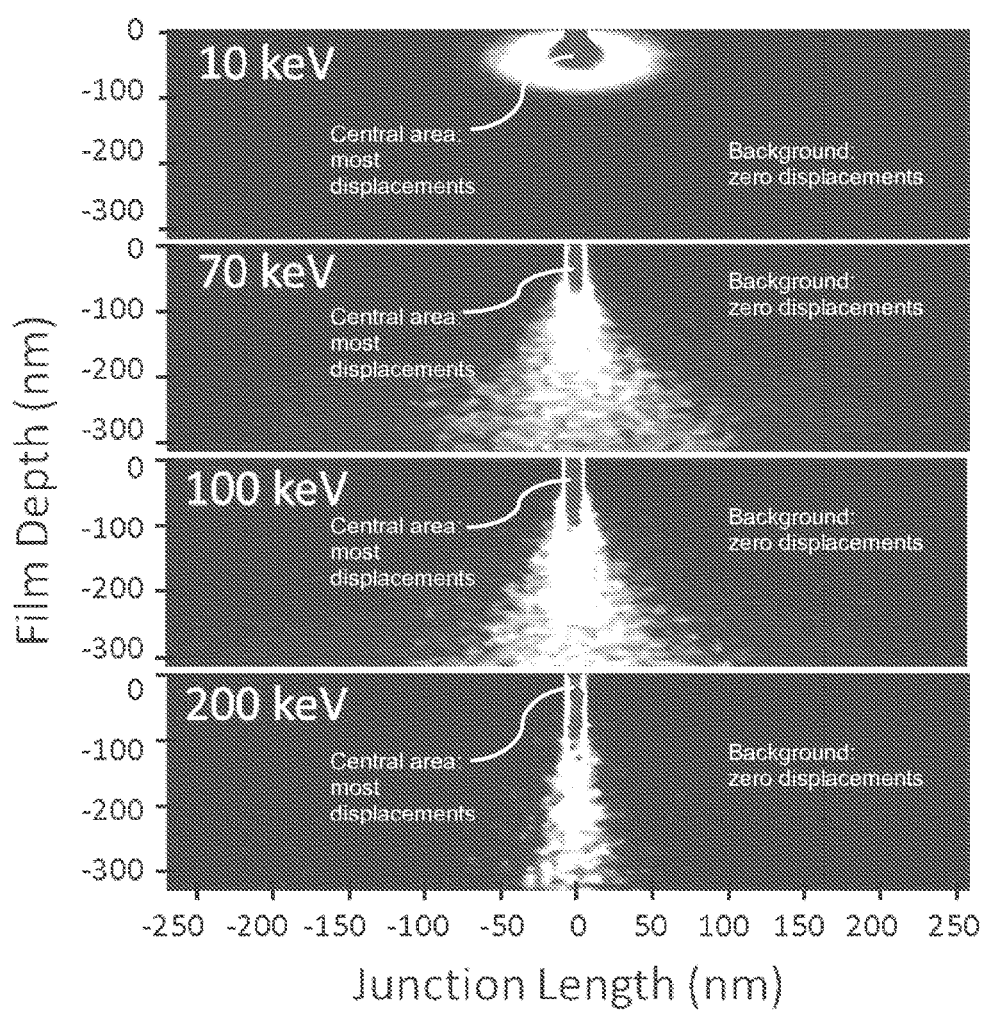
FIG. 5A is a rainbow contour plot (converted to grayscale) of the number of displacements per nm$^3$ per ion induced in superconducting YBCO generated from a 1 nm focused helium beam. The dark general background area signifies zero displacements and dark central upper portion of the structure signifies the largest number of displacements.
Figure 5B:
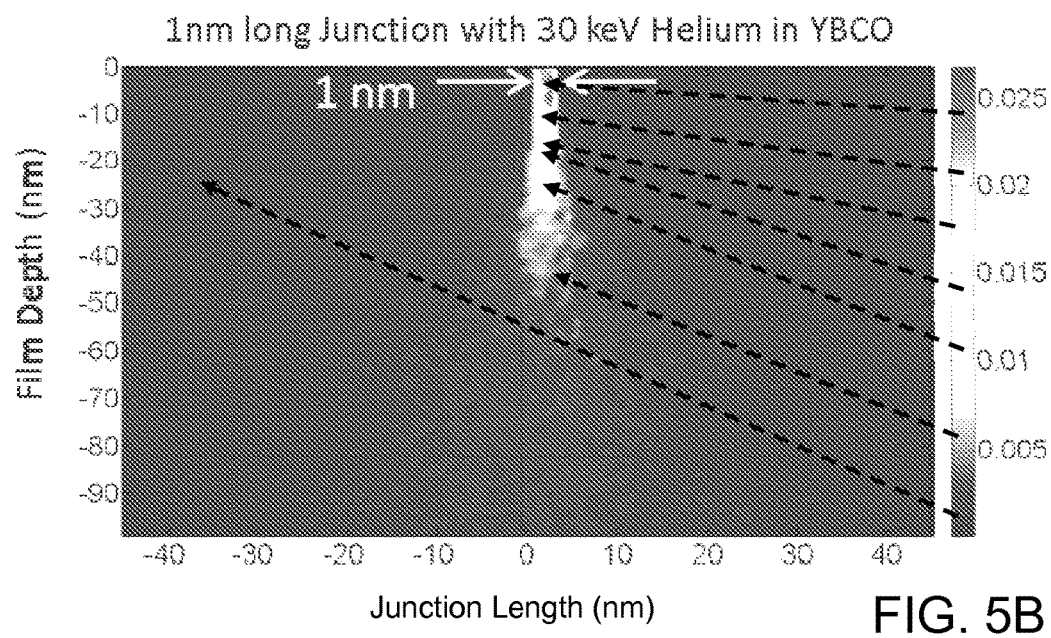
FIGS. 5B and 5C provide rainbow contour plots (converted to grayscale) of the number of displacements per nm$^3$ per ion induced in superconducting YBCO generated from a 1 nm focused helium beam (5B) and 30 nm beam (5C). The dark area in the general background signifies zero displacements while the dark in the central portions of the structure signifies the largest number of displacements.
Figure 5C:
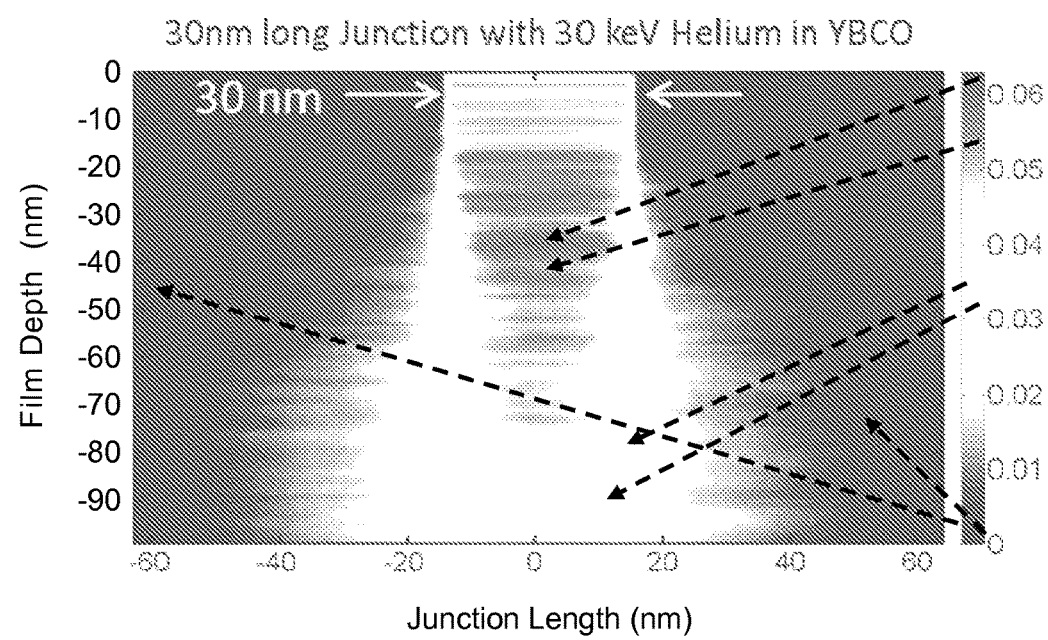

The energy-depth-lateral straggle relationship can be seen in FIGS. 5A-C, which are gray-scale versions of rainbow contour plots of the number of displacements per nm$^3$ per ion induced in superconducting YBCO generated using different energies (FIG. 5A) and different width beams (FIGS. 5B-5C). In FIGS. 5B-5C, to compensate for the lack of color in the figures, dashed arrows are provided to indicate the corresponding areas of the plots to the scale on the right side of the plots. The desirability of higher energy beams is clear from FIG. 5A, where the 10 keV beam exhibits significant lateral straggle at a relatively shallow film depth. A 70 keV beam penetrates to around 80 nm before lateral straggle starts. A 200 keV beam shows little lateral spread approaching 150 nm film depth.

Figure 2:
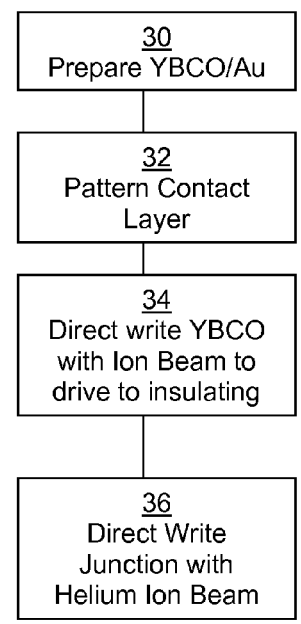
FIG. 2 provides an alternative process flow for fabrication of Josephson junctions.

While photolithography was used in the above-described process to pattern the bridges and electrodes, alternative patterning techniques may be used, as will be apparent to those in the art. An exemplary alternative process flow is shown in FIG. 2. For example, the NANOFAB™ tool from ZEISS® contains both neon and helium focused ion beams. After preparation of the YBCO/Au file as described above (step 30), the neon beam could be used to direct-write the pattern features (step 32) with better resolution (~30 nm), and hence much finer feature sizes than those obtainable using photolithography. (Note that this direct writing step can be achieved with any focused ion beam, including gallium, and neon helium.) The photolithographic and ion milling processes damage the edges of the bridge and can make the edge material inhomogeneous. This could be used to significantly increase junction uniformity and density beyond what could be obtained using the described procedures. Furthermore nano-scale flux pinning centers could also be inserted into the electrodes using the neon beam to increase the current density, reduce flux noise and substantially improve SQUID devices.

Ion milling, as used in step 16 of the process of FIG. 1, was used to reduce the thickness of YBCO, however, the neon or helium ion beam could be used in step 34 to first mill away the top part of a thicker film, followed by the irradiation of a Josephson barrier (step 36). Steps 34 and 36 are essentially the same, however, step 34 may be performed with either a helium or a neon ion beam, depending on the desired initial resolution, while step 36 uses helium to achieve the finest resolution. Having a narrower, thinned-down film localized to the Josephson junction region would yield electrodes that have better magnetic shielding properties and could potentially increase the critical current.

Still another alternative technique may be used for fabricating Josephson junctions with the desired characteristics described herein. In this process, the starting film would be a relatively thick (~150 nm) superconducting layer, e.g., YBCO or other, capped with a 200 nm thick film of gold (or other conductive metal). A helium ion beam is used to direct write steep narrow trenches in the gold layer, so that the superconducting materials are exposed. The gold layer then serves as a mask during broad area high energy ion implantation of the superconductor to form Josephson junctions. The advantage with this approach is that a thicker film can be used due to the high energy ion implant, which will yield higher $I_C R_N$ values.

FIG. 3B provides a zoomed-in view of the central substrate region showing where the gold contact region and YBCO film were etched prior to junction fabrication. The current (I) and voltage (V) leads for one of these bridges is labeled. Samples were then loaded into the helium ion microscope and the 30 kV helium beam was scanned across the 4-μm wide superconducting bridges. This particular pattern contained four, 4 μm wide contacts for four-point resistance measurements. The helium ion beam was scanned along the dotted lines shown in FIG. 3B. FIG. 3C provides an artist's rendition of the focused helium ion beam creating a Josephson junction in the YBCO film. The illustrated crystal structure corresponds to the generally orthorhombic structure of YBCO.

As evidenced by the test results described below, the above-described procedures can be used to successfully and reproducibly create devices with excellent junction uniformity and electrical properties. However, a few relatively simple innovations could be made to further improve the resulting device performance, namely, increasing $I_C R_N$ even further by using higher energy beams. Higher energy beams will create even narrower barriers that will increase $I_C$ considerably since the tunneling limit depends exponentially on the barrier width. Currently, gas field helium ion sources are limited to ~30 kV because it is the optimum extraction energy, however a negative bias could be added to the substrate to effectively increase the energy of the irradiation. Higher energies would also allow for the use of thicker films which have higher critical currents and better magnetic screening capability. Another innovation that would greatly enhance this process would be to add a laser interferometer to the stage to keep the beam focused while moving across a non-level substrate, such as those used in commercial electron beam lithography machines.

Figure 3D:
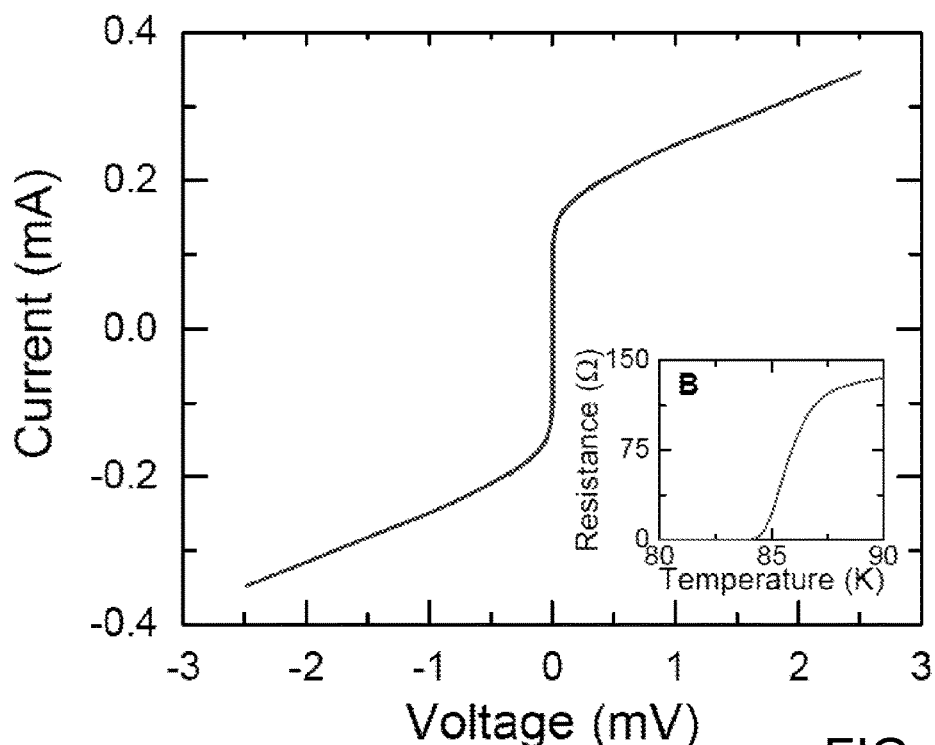
FIG. 3D shows the I-V characteristic with large excess current for a YBCO sample irradiated with a relatively small dose of $1 \times 10^{16}$ He+/cm$^2$. The inset plots resistance as a function of temperature.
Figure 3E:
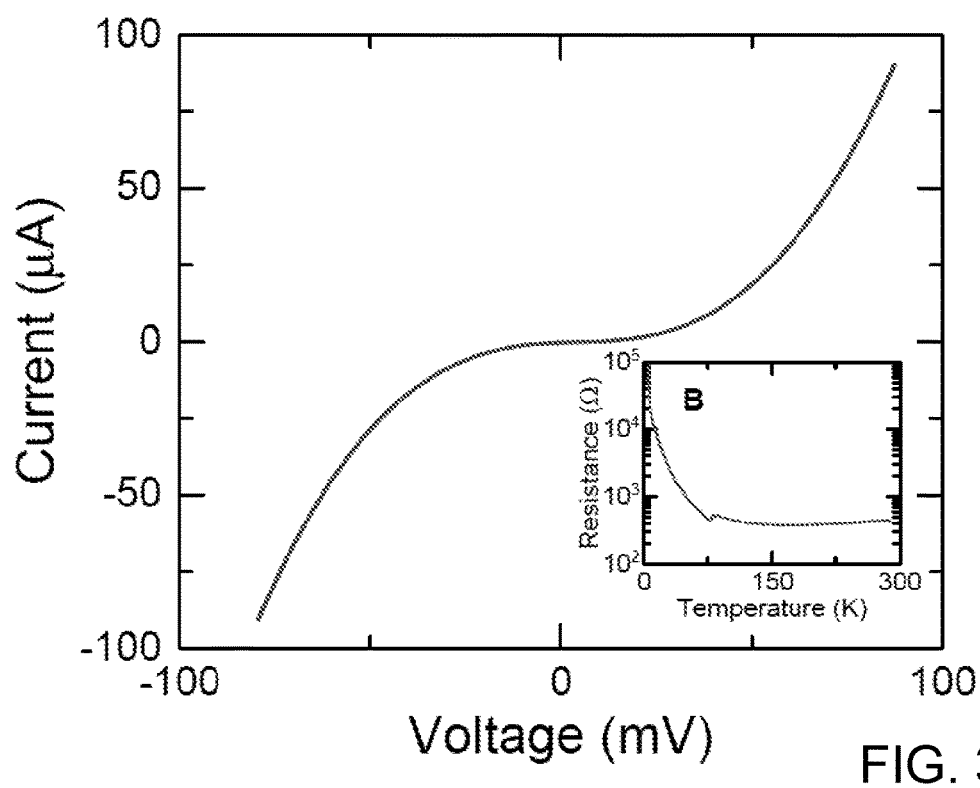
FIG. 3E provides the I-V characteristic for a YBCO sample irradiated with a relatively high dose of $6 \times 10^{17}$ He+/cm$^2$. The inset plots resistance as a function of temperature.

Over 30 test samples were written with ion fluence ranging between $10^{14}$ and $10^{18}$ He$^+$/cm$^2$. As shown in FIG. 3D, at the lower values, no Josephson current was observed and Andrev reflections dominated transport. In contrast, at the higher doses, the devices exhibited strong localization characteristics with insulating behavior, as plotted in FIG. 3E. In between these two extremes doses, very high-quality Josephson junctions could be created and made to continuously transition, as predicted by BTK, from SNS junctions, well-described by the resistively shunted Josephson model (RSJ), to SIS Josephson tunnel junctions.

Figures 3F, 3G:
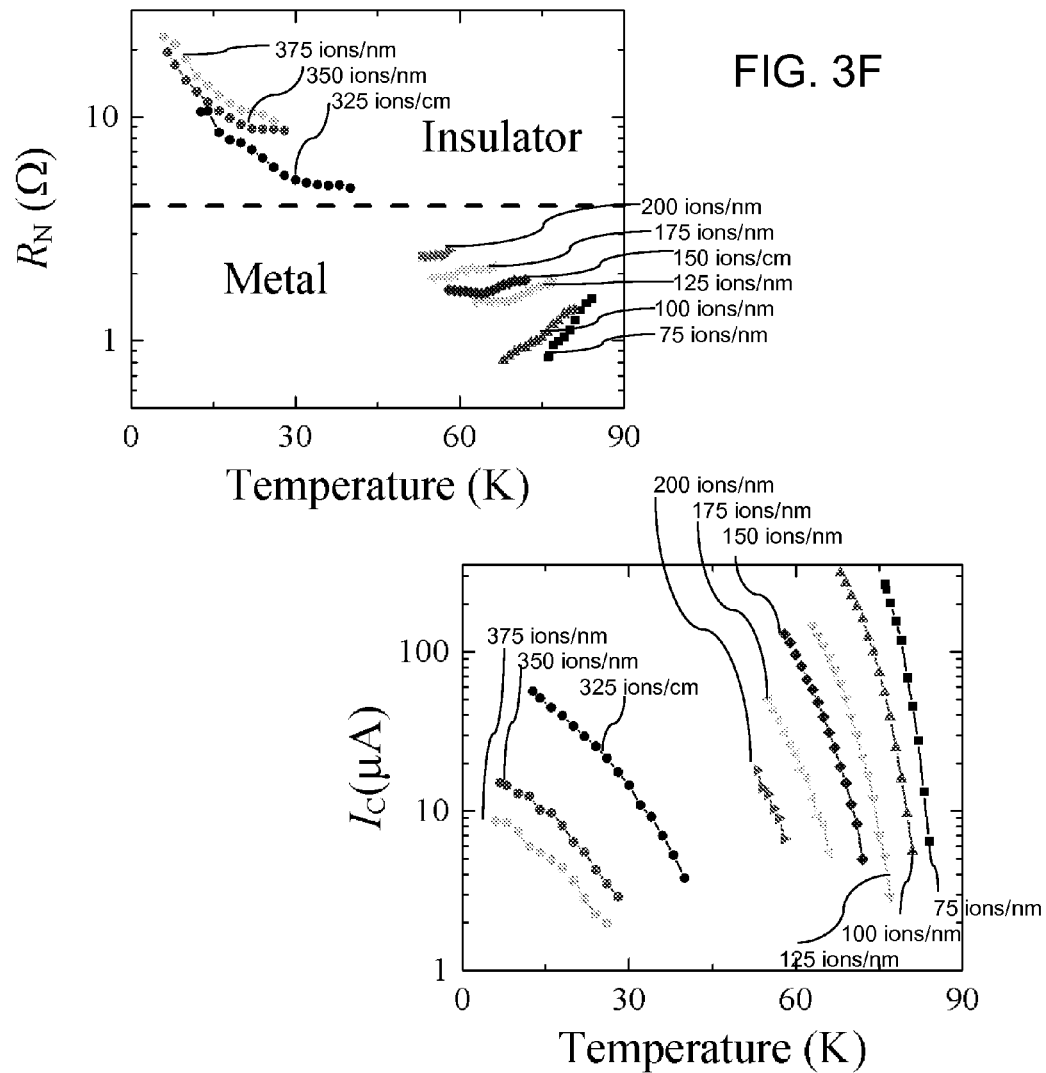
FIGS. 3F-3H are plots showing fine tuning of electrical characteristics enabled by merely varying the dose of the helium ion beam.
Figure 3H:
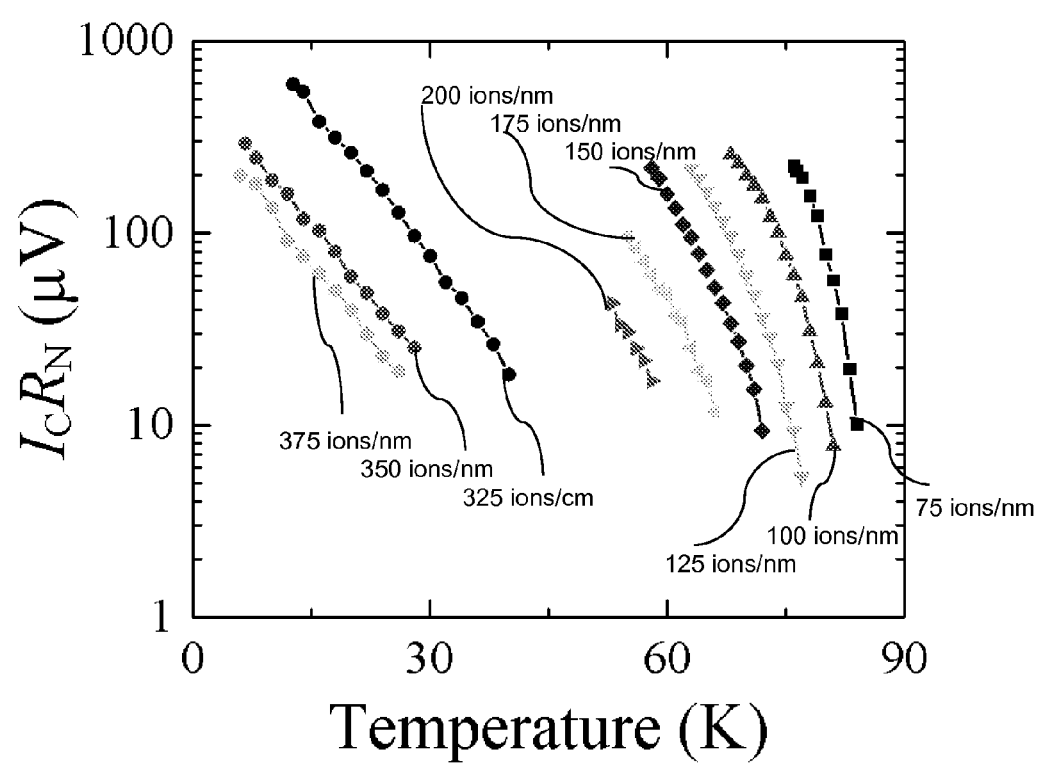

FIGS. 3F-3H provide another illustration of the fine tuning of electrical characteristics enabled by merely varying the dose in 25 nm films and 4 micron wide devices. FIG. 3F shows the crossing of the metal-insulator transition (in terms of normal state resistance $R_N$) within the dose range between of 200 ions/nm and 325 ions/nm, demonstrating continuous control through the transition. FIG. 3G plots critical current $I_C$ with temperature, illustrating that the temperature sensitivity decreases with dose. FIG. 3H plots $I_C R_N$ with temperature, showing the fine tuning capability of the inventive process.

The electrical properties across very narrow irradiated regions differ greatly from that of wide ones, and at the time of the tests described herein, there was no reported data on very narrow irradiated regions. To obtain an accurate estimate of the dose range without the use of cryogenic measurements the following procedure was used: The room temperature resistivity of every 4-point bridge was measured at room temperature using a probe station and a lock-in amplifier. Samples were then loaded into the helium ion microscope and the narrow barriers were irradiated. The resistance of the samples was remeasured immediately after exposure and the change in resistance was determined. From this, the resistivity of the irradiated region was calculated and compared to previously published results in bulk films.

The following examples describe characteristics and performance of exemplary Josephson junctions fabricated according to the inventive process.

Example 1: Typical SNS Junction

Figure 6A:
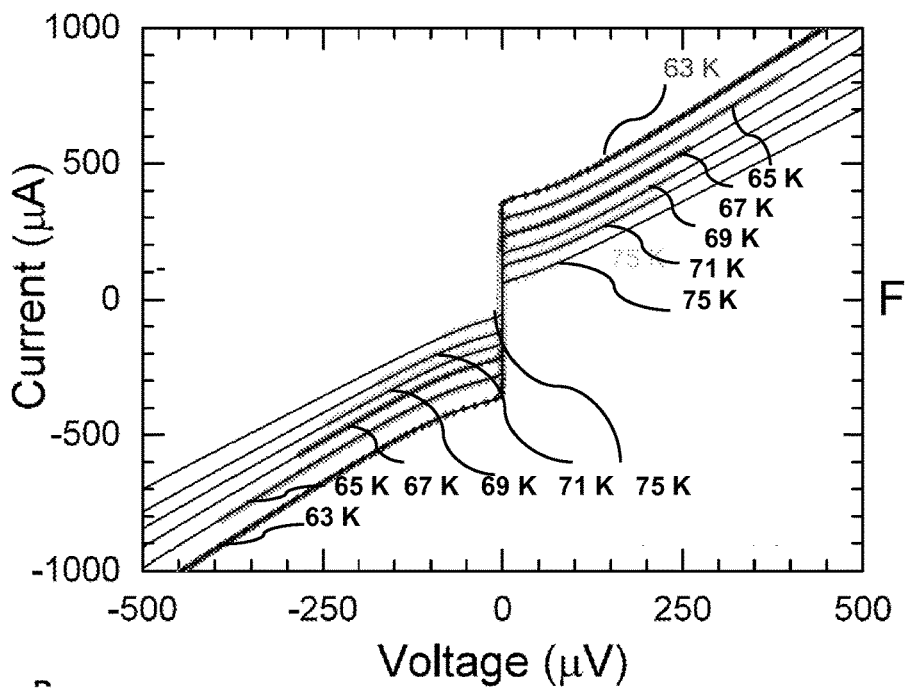
FIG. 6A is a plot of I-V characteristics of a YBCO SNS Josephson junction at temperatures 63, 65, 67, 69, 71, 75 and 79 K.
Figure 6B:
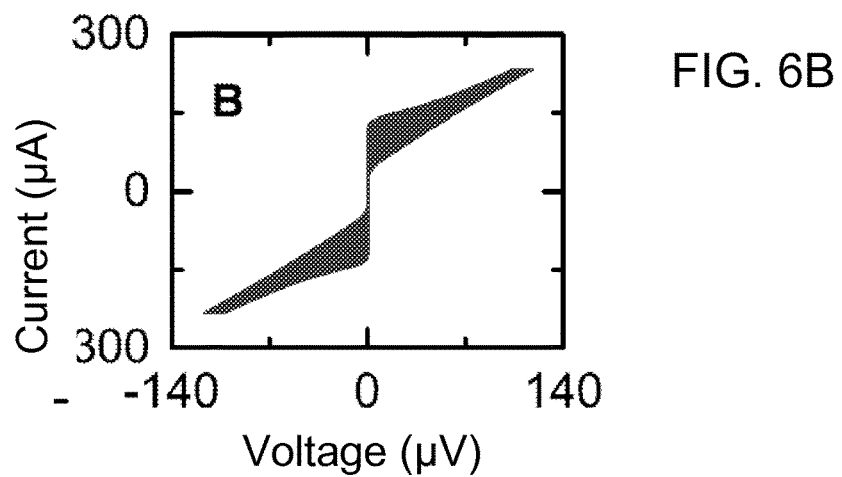
FIG. 6B is an I-V plot for the same junction modulated with an AC magnetic field to determine the excess current.

The current voltage characteristics (I-V) are shown in FIG. 6A for a typical SNS Josephson junction measured for several temperatures. They were fit with integral form of the Ambegaokar-Halperin (A-H) model (V. Ambegaokar, B. I. Halperin, *Phys. Rev. Lett.* 23, 274 (1969)), and with the addition of added excess current determined by suppressing the Josephson current with magnetic field (FIG. 6B). From the fits, one can determine $I_C$, $R_N$, and the noise temperature $T_N$. Including $I_\chi$ in these fits is essential to obtain realistic values of $I_C R_N$, which are almost always incorrectly overestimated in analysis of YBCO junctions because of the inclusion of excess current in the estimate of $I_C$.

Figure 6C:
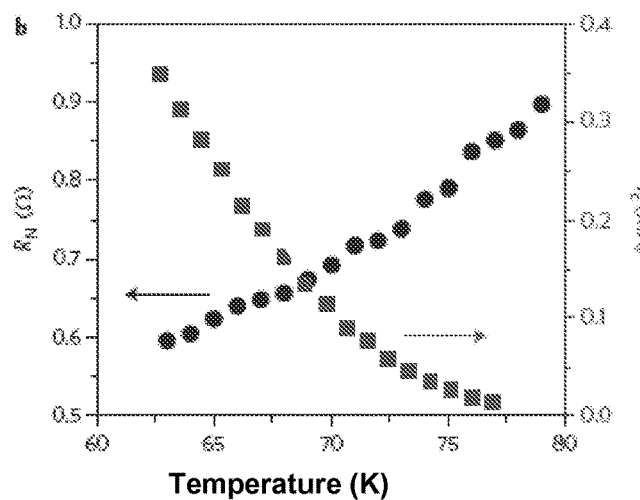
FIG. 6C shows the fitted values $I_C$ and (T)

FIG. 6C shows the fitted $I_C$ and $R_N$ values as functions of temperature. The noise temperature of the measurement system was found to be 130 K. The decrease in resistance as temperature is lowered indicates the barrier is a conductor. The resistance ~1Ω is roughly 10× larger than typical ion irradiated Josephson junctions for the same bridge width. Interestingly, the dose $2\times10^{16}$ He$^+$/cm$^2$ used to create this junction is about 10 times higher than that required to drive YBCO insulating when delivered to a large area.

Simulations suggest that the difference may be due to the overlap of defects from lateral straggle when doses are delivered to a two-dimensional area as opposed to a one-dimensional line. The temperature range for RSJ characteristics (~30 K) is much larger than that for proximity effect ion irradiated junctions (~3 K) (27) suggesting that the strength of the barrier is much larger and more efficient at suppressing the Andreev reflection (excess current) transport mechanism.

Figure 6D:
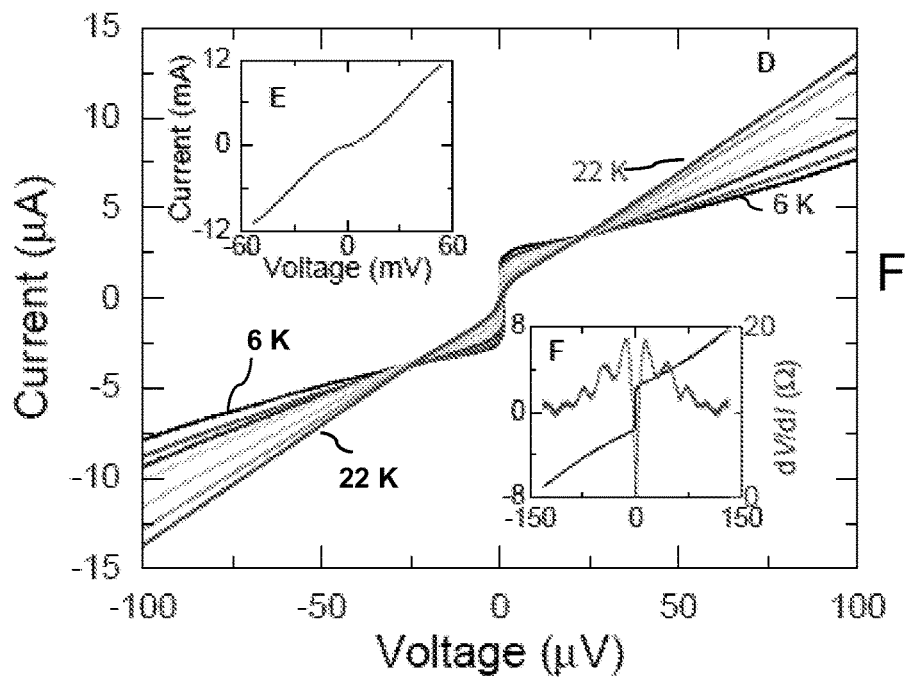
FIG. 6D is a plot of I-V characteristics of a YBCO SIS Josephson junction at 6, 10, 12, 14, 16, 18, and 22 K.
Figure 6E:
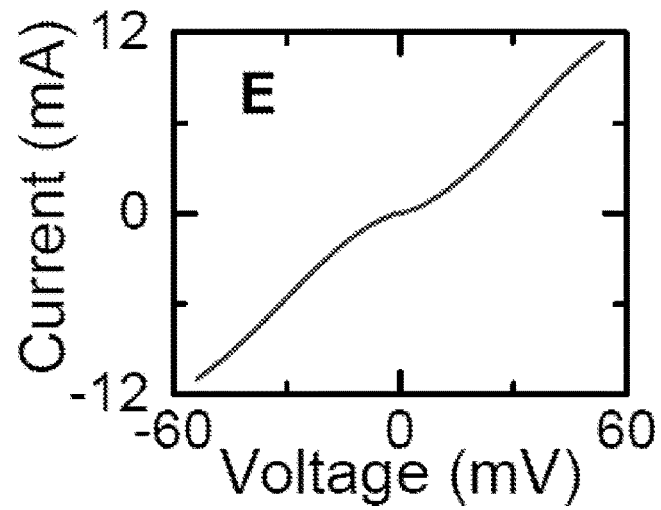
FIG. 6E (also inset in FIG. 6D) is a plot of high current bias I-V measurement.
Figure 6F:
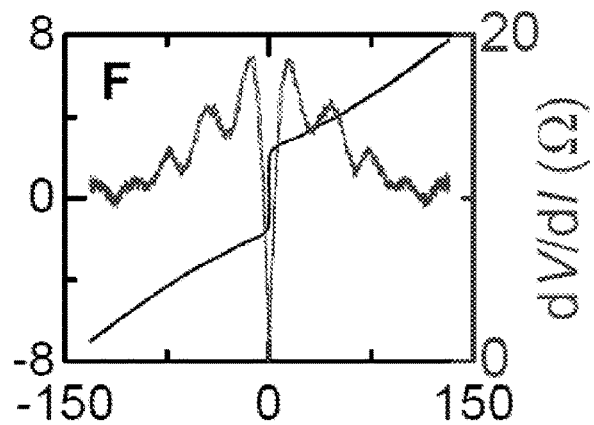
FIG. 6F (also inset in FIG. 2D) is a plot of differential resistance of the junction at 6 K exhibiting resonant AC Josephson cavity modes.

In stark contrast, FIG. 6D shows I-V for several temperatures of an YBCO, SIS junction fabricated by irradiation with a higher dose of $6\times10^{16}$ He$^+$/cm$^2$. Unlike the junction shown in FIG. 6A, the resistance of this junction increases as temperature is decreased, indicating that the barrier is an insulator as opposed to a disordered metal (FIG. 6A). Measurements of the dynamic resistance (dV/dI) reveal 5 orders of AC Josephson resonant cavity modes (Fiske steps) generated at finite voltage due to the Earth's magnetic field with period of 35 μV (FIG. 6E). This implies that there is a well-defined dielectric barrier. As shown in FIG. 6F, at higher current bias the SIS nature of the I-V is more apparent and conductance peaks are visible at V=±32 mV.

Figure 7A:
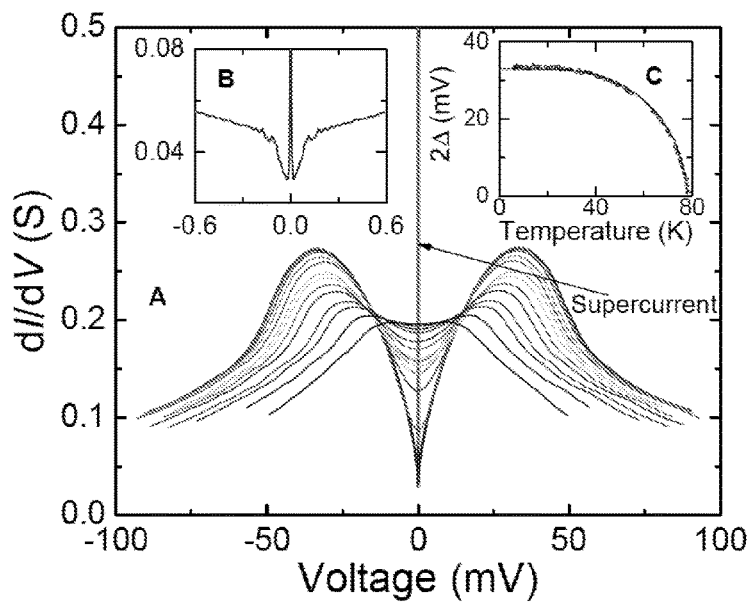
FIGS. 7A-7D provide measurement results for a YBCO SIS Josephson junction, where
Figure 7B:
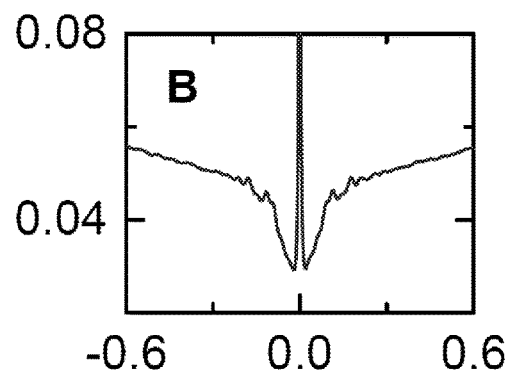
Figure 7C:
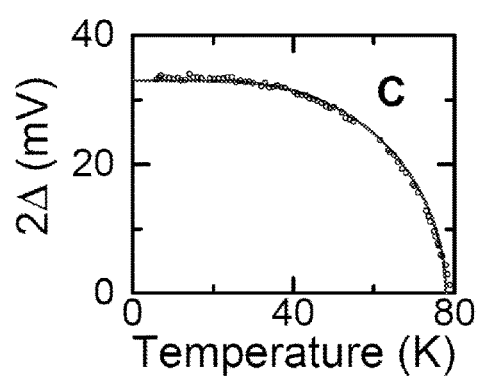
Figure 7D:
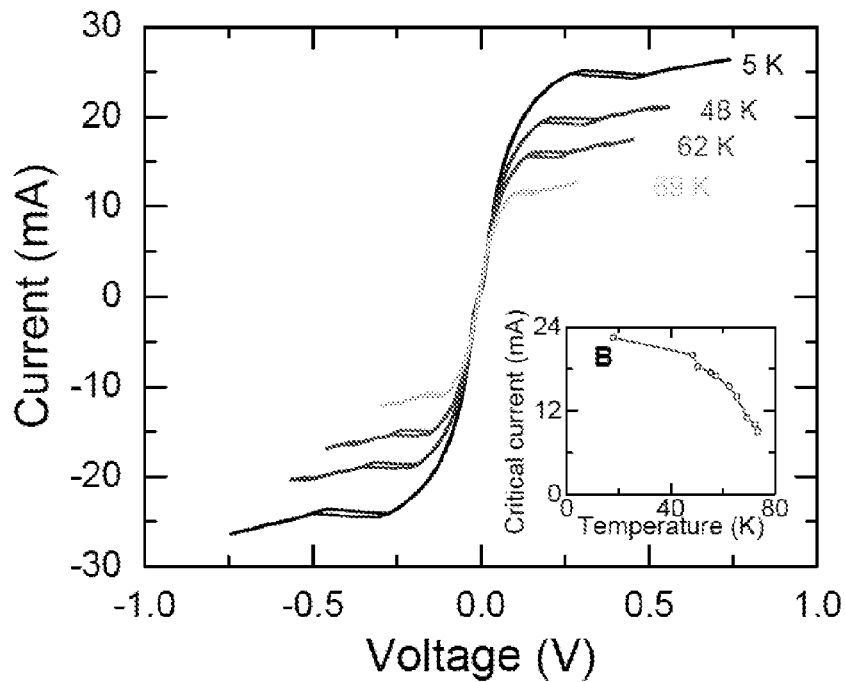

The differential resistance was measured using low frequency techniques and dI/dV is plotted in FIG. 7A for the temperatures ranging from 70 to 6 K in 5 K increments. FIG. 7B provides a zoomed-in view in the low bias regime around the super current. The conductance peaks are defined to represent a superconducting energy gap, $2\Delta$, and is plotted as a function of temperature in FIG. 7C. This data fits surprisingly well to the BCS gap temperature dependence with only the two parameters $2\Delta=33$ mV and $T_C=77.8$ K. The conductance decrease above $2\Delta$ is a common occurrence in HTS tunnel junctions unlike those made from conventional superconductors. Without wishing to be bound by theory, it is believed that this is due to an additional voltage caused by flux flow in the electrodes from the high current density. To support this notion, I-V was measured above the critical current of the electrodes for many temperatures. FIG. 7D shows that this curvature increases rapidly up to the critical current of the electrodes.

Example 2: SIS Versus SNS $I_C$ Comparison

Figure 8:
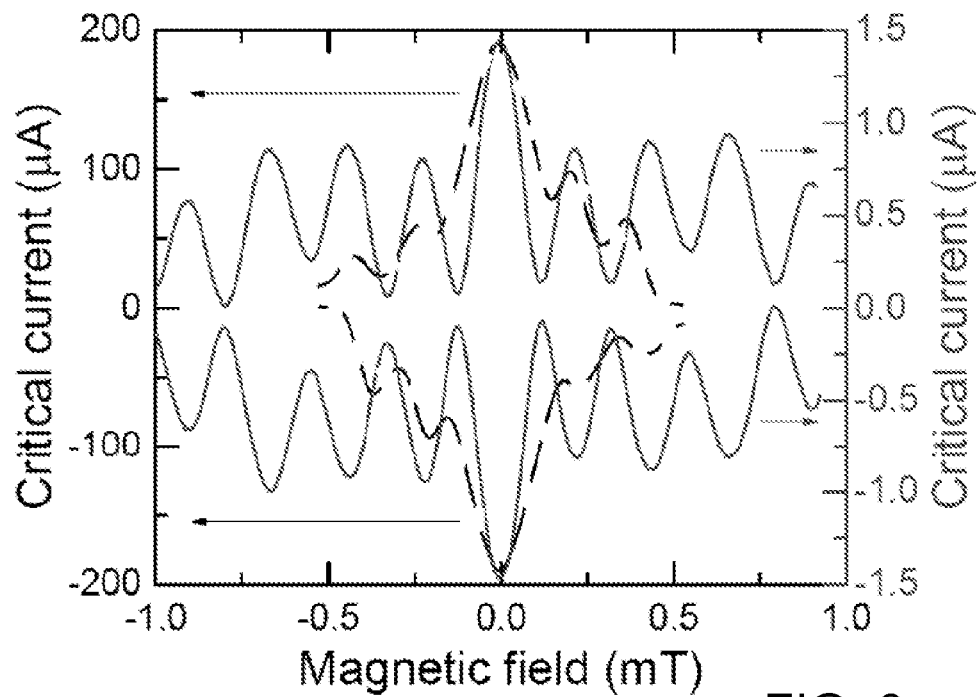
FIG. 8 shows the Fraunhofer diffraction patterns for the critical current in magnetic field of a SNS (broken line) and a SIS (solid line) Josephson junction at 77 and 5 K respectively.

To gain insight about the uniformity and distribution of the Josephson current in these junctions, we measure and compare the critical current as a function of magnetic field for an SIS and SNS junction (FIG. 8). Both diffraction patterns deviate substantially from the ideal Fraunhofer patterns of classical sandwich type junctions due to the facts that the films used in this study are much thinner than the magnetic penetration depth $\lambda_\perp \sim 250$ nm and that the magnetic field is applied perpendicular to the film as opposed to parallel, which is the case for sandwich-type junctions. For the very thin films used in this study (t=30 nm), the 2D penetration depth is given by $\lambda_\perp \equiv \lambda_L^2/t = 2$ μm. This implies that the Josephson penetration depth is even larger and that the junction is in the weak shielded limit. Vortices in the electrodes may partially enter the junction and alter the current distribution in the junction. In the case of the tunnel junction, with small critical current ~2 μA, the pattern is more SQUID-like because the current is concentrated closer to the edges. This effect was predicted by Humphreys and Edwards (*Physica C.* 210, 42 (1993)) and later by Clem (*Phys. Rev. B* 81, 144515 (2010)) in their work describing the magnetic field characteristics of planar Josephson junctions. For the SNS junction the larger critical current ~100 μA generates a self-magnetic field that skews the current distribution like in long-Josephson junctions. Despite the unconventional shape, both patterns are reproducible indicating high uniformity and very little trapping of flux.

Example 3: Junction Uniformity—SNS Array

Figure 9A:
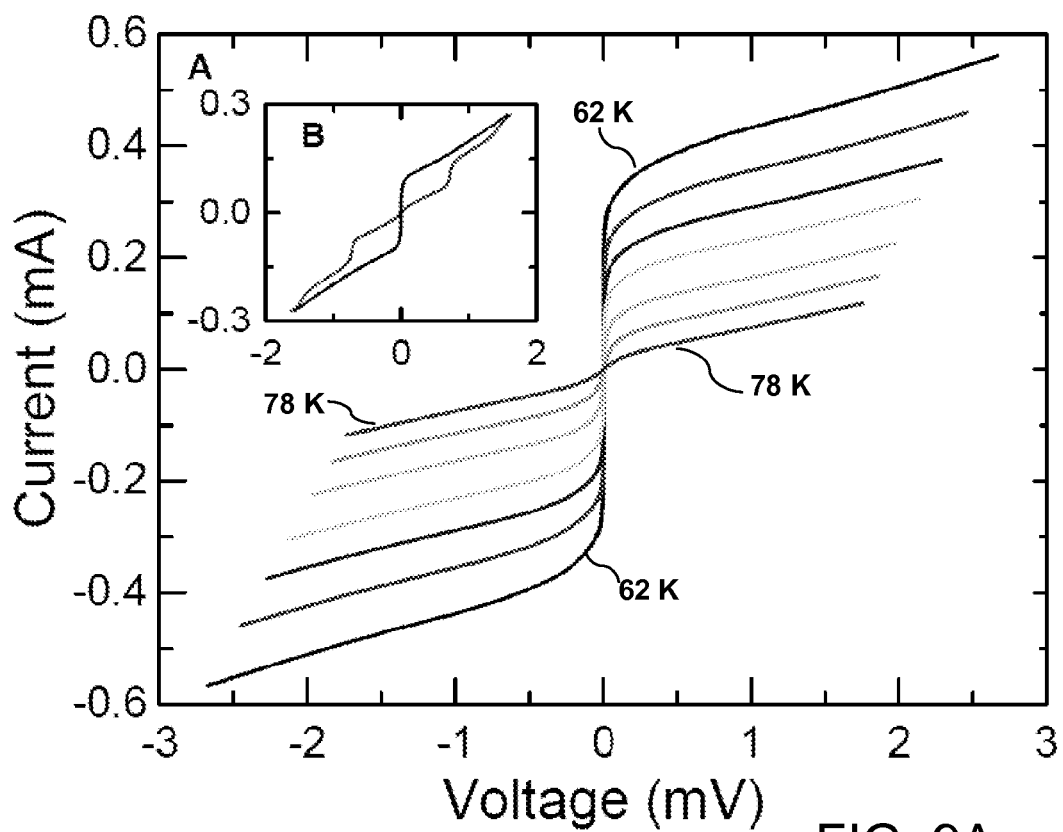
FIGS. 9A-9D show current-voltage characteristics of YBCO, Josephson junction arrays containing 20 junctions, where FIG. 9A provides results for a SNS junction array measured at the temperatures of 62, 64, 66, 68, 71, 74, and 78 K.

To further test the uniformity the helium ion beam junctions, arrays of closely spaced junctions connected in series were constructed by scribing multiple lines across the bridge. FIG. 9A shows I-V for several temperatures of a 20 junction SNS series array with inter junction spacing of 500 nm. The arrays exhibit much less rounding near the critical current than previously reported Josephson arrays suggesting very good uniformity of $I_C R_N$.

Figure 9B:
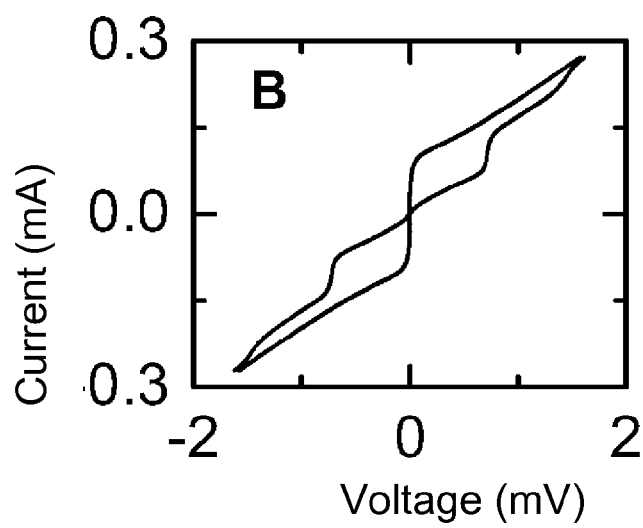
Figure 9C:
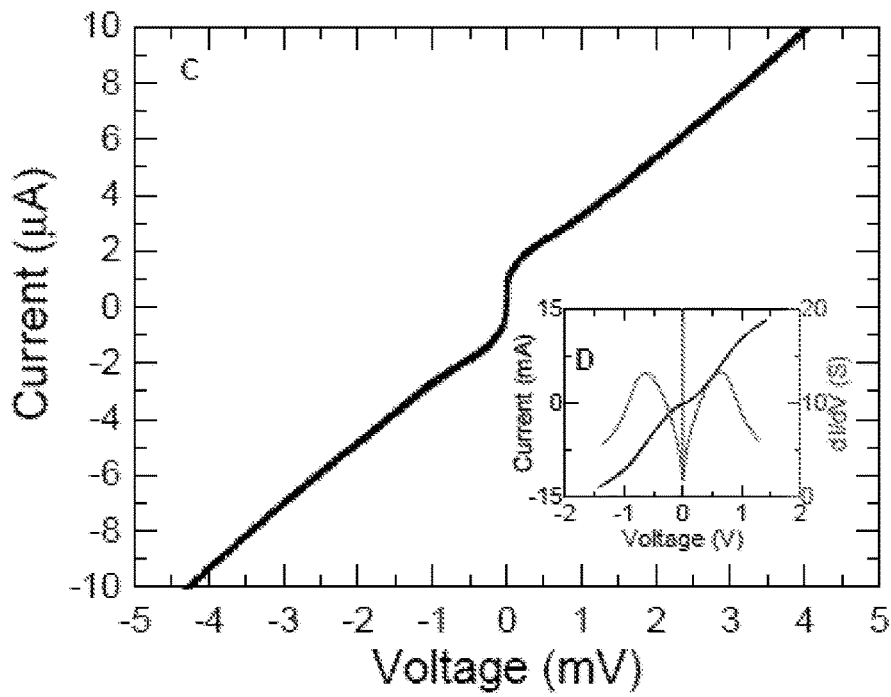
Figure 9D:
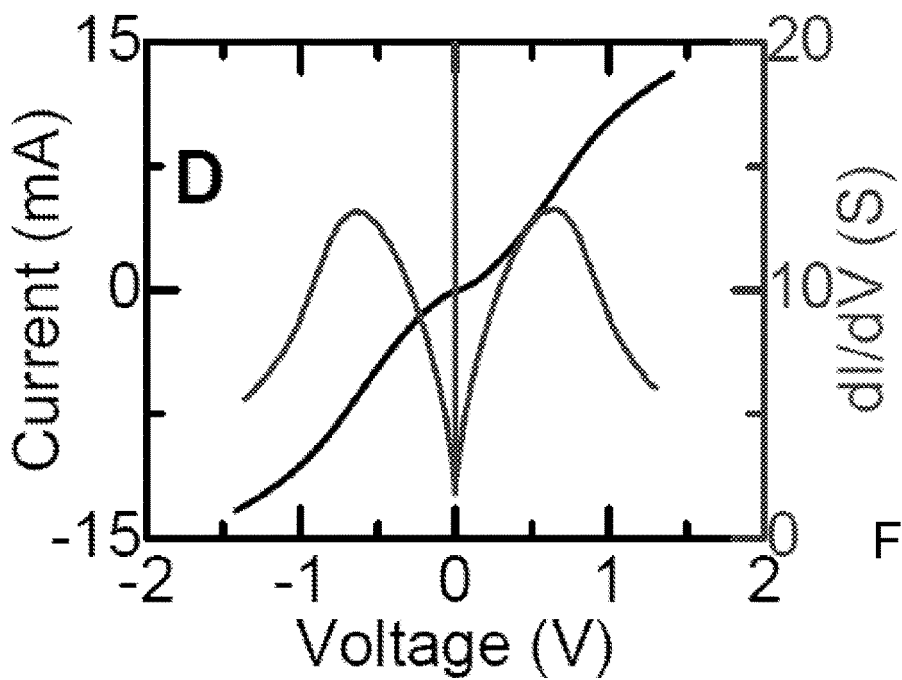

This high level of uniformity is also apparent when characterizing the array using the AC Josephson effect. FIG. 9B shows a 20 junction array irradiated with RF from an open circuited coax cable at 17.6 GHz. A large pronounced flat giant Shapiro step is observed at $$20 \times \frac{hf}{2e} = 0.727 \text{ mV},$$

suggesting that the fundamental voltage step for each junction within the array is occurring at the same bias current. This situation will only occur if the resistances are nearly the same. A series array of 20 SIS junctions was also created and I-V is shown in FIG. 9C. It also shows very good uniformity and minimal rounding near $I_C$. At higher voltage conductance peaks can be observed at $20 \times 2\Delta = 640$ mV, a further testament to the reproducibility of these junctions.

Example 4: Junction Uniformity—SIS SQUID Array

Figure 10A:
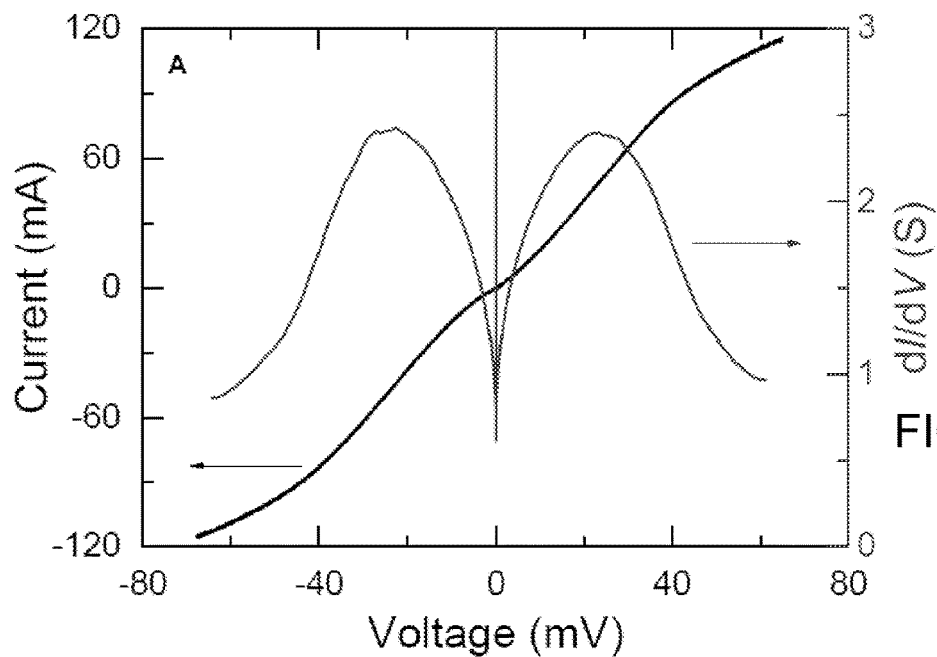
FIGS. 10A-10D provide measurements of a SIS parallel SQUID array, where FIG. 10A plots I-V and dI/dV measured at 5 K.
Figure 10B:
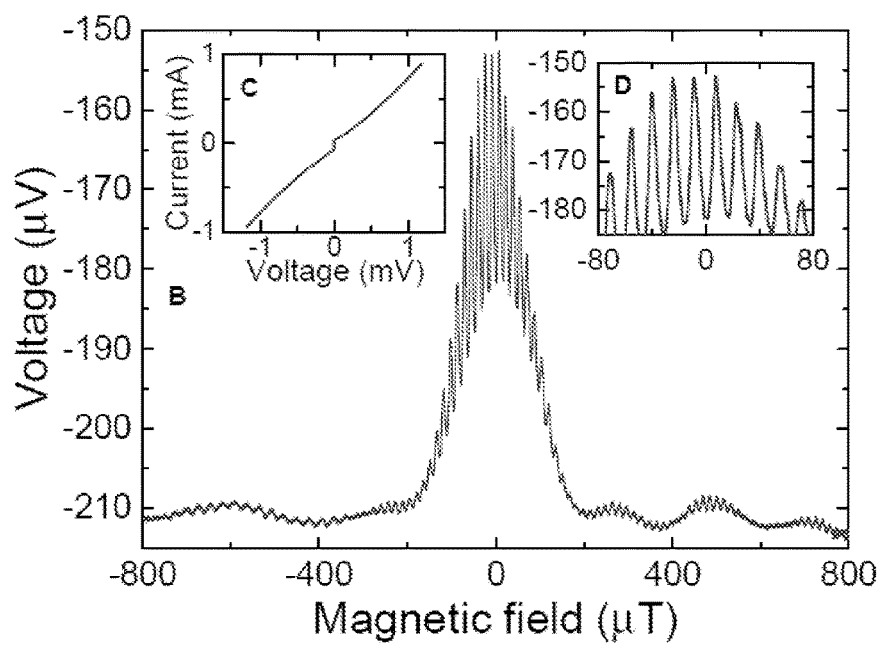
Figure 10C:
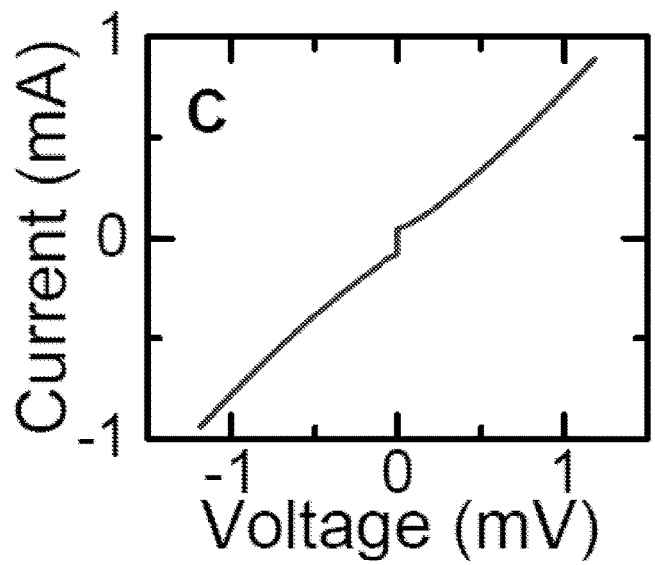
Figure 10D:
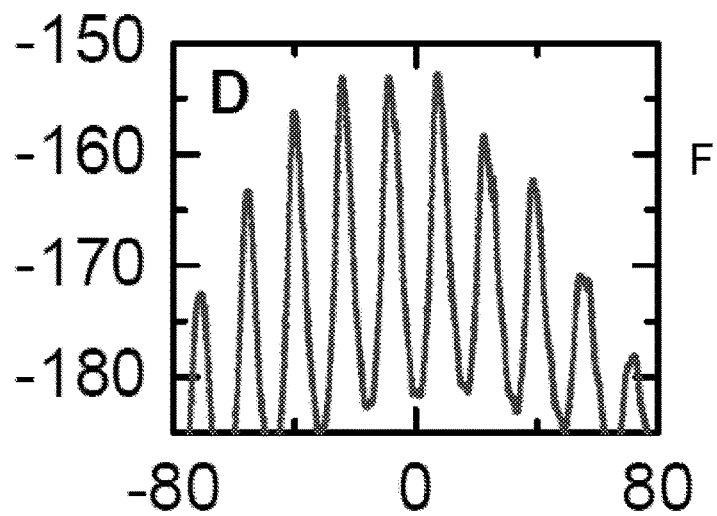

An array of SIS junction SQUIDs was also fabricated. Five rectangular superconducting loops each with area $12 \times 4$ $\mu m^2$ connected in parallel were patterned using the same process described above except the film was slightly thicker ~35 nm. The I-V and its derivative are shown in FIG. 10A. As with the other tunnel junction devices, the SQUID also exhibits conductance peaks at $2\Delta=32$ mV. The array was biased with a static current of 120 μA and the voltage was measured as a function of magnetic field and the resulting Fraunhofer and SQUID oscillations are shown in FIG. 10B. The Fraunhofer pattern shows self-field asymmetry in magnetic field like the single junctions with larger critical currents. The SQUID pattern exhibits a periodicity of 25 μT and a modulation depth of 40 μV (FIG. 10C). Based on the ratio of the two patterns (~50%), the inductive parameter $\beta_L = 2LI_C/\Phi_0$ was estimated to be equal to 1.0. This yields a very large value for the inductance $L=0.5$ nH, which is predominately kinetic inductance due to the use of very thin films. From the work of Meservey and Tedrow (*J. Appl. Phys.* 40 (1969)) using L, $\lambda_L$ was calculated to be 1 μm confirming the earlier conclusion that the penetration depth in these ultrathin films is very long.

Example 5: DC Washer SQUIDs

Figures 11A, 11B:
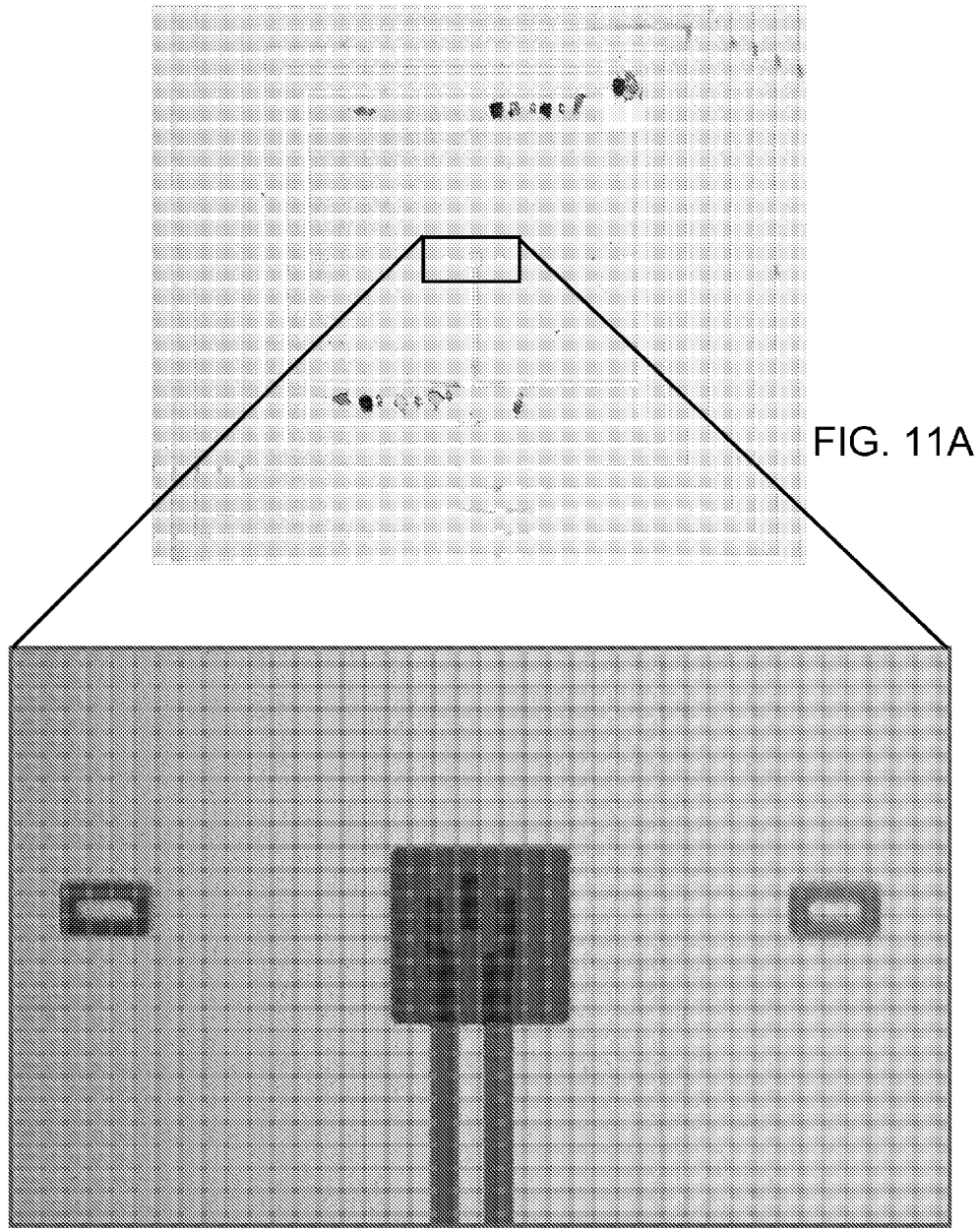
FIGS. 11A and 11B are optical photographs of a DC washer SQUID fabricated according to an embodiment of the invention, where

DC washer SQUIDs were patterned with conventional photolithograph and ion milling from 120 nm thick YBCO films grown by reactive co-evaporation on cerium oxide buffered sapphire with a sputtered gold contact. The design consisted of a 1 mm×1 mm square washer with a multi-turn planar input coil, shown in FIG. 11A. The gold contact was removed in the area intended for junctions (FIG. 11B) and the YBCO film in this region was ion milled down to about 30 nm thickness to ensure that the 30 kV helium ion beam would completely penetrate the YBCO and create a uniform barrier. Several devices were fabricated using helium doses ranging between $2\times10^{16}$ and $9\times10^{16}$ ions/cm$^2$. SQUIDs written with doses less than $4\times10^{16}$ ions/cm$^2$ had superconductor-normal metal-superconductor (SNS) junctions. At higher doses, the junctions were superconductor-insulator-superconductor (SIS) junctions.

Figures 12A, 12B:
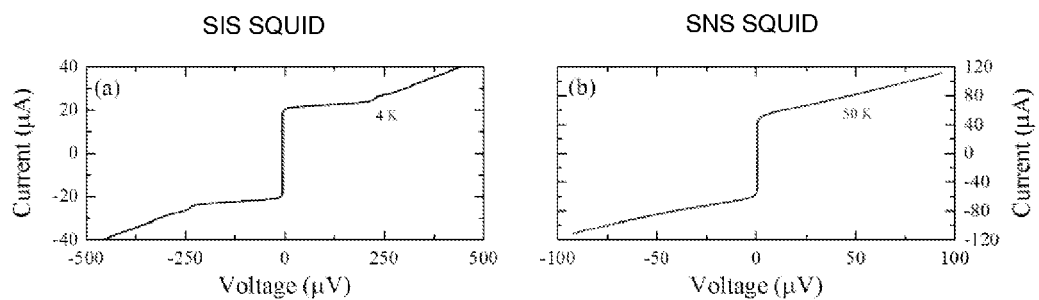
FIGS. 12A-12F show testing results for SIS and SNS SQUIDS fabricated according to the invention.

FIGS. 12A and 12B compare the electrical transport measurements for SIS and SNS SQUIDs at 4 and 50 K, respectively. The current-voltage characteristics (I-V) of both the SIS (FIG. 12A) and SNS (FIG. 12B) SQUIDs exhibit resistively shunted junction characteristics wee-described by the Stewart-McCumber model for small voltages. The $I_0R$ products, where $I_0$ is the critical current of the SQUID, for the SIS and SNS SQUIDs are 270 and 60 μV respectively. The Stewart-McCumber parameter $\beta_C \equiv 2\pi I_0 R^2 C/\Phi_0 = 0.032 \ll 1$ for the SIS SQUID, which explains why there is no hysteresis in the I-V characteristics. This comes about from a very small capacitance ($C \cong 3$ fF) due to the small electrodes. The SIS SQUID exhibits a rise in I-V~250 μV that is independent of temperature, which rules out the possibility that it is a secondary critical circuit.

Figures 12C, 12D:
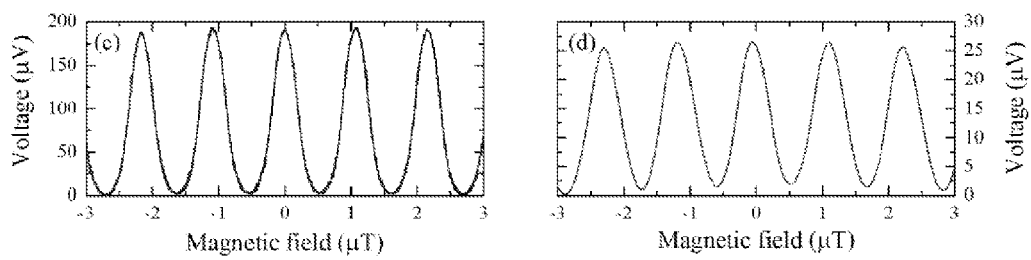
Figures 12E, 12F:
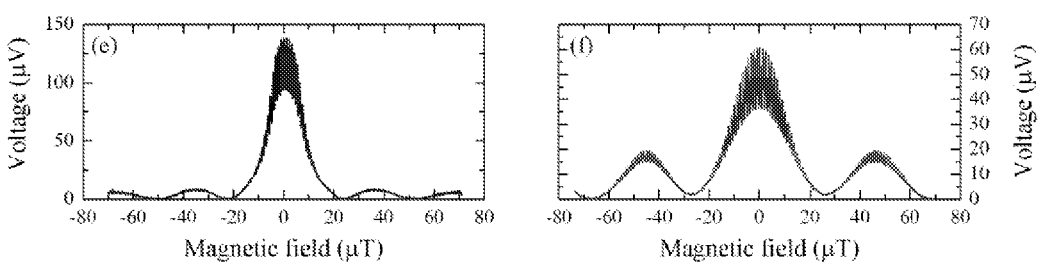

The SQUIDs were DC biased above the critical currents and the voltages were measured as functions of magnetic field (FIGS. 12C and 12D). Both the SIS and SNS devices exhibited a well-behaved voltage modulation of approximately ¾ to ½ $I_0R$, respectively. Measurements were taken for a large magnetic field range to observe the Fraunhofer envelopes at the junctions. The first minima occurs near 25 μT for both devices (FIGS. 12E and 12F). The second minima occur at 50 and 70 μT for the SIS and SNS SQUIDS, respectively. This reason for this discrepancy is not apparent.

Figure 13:
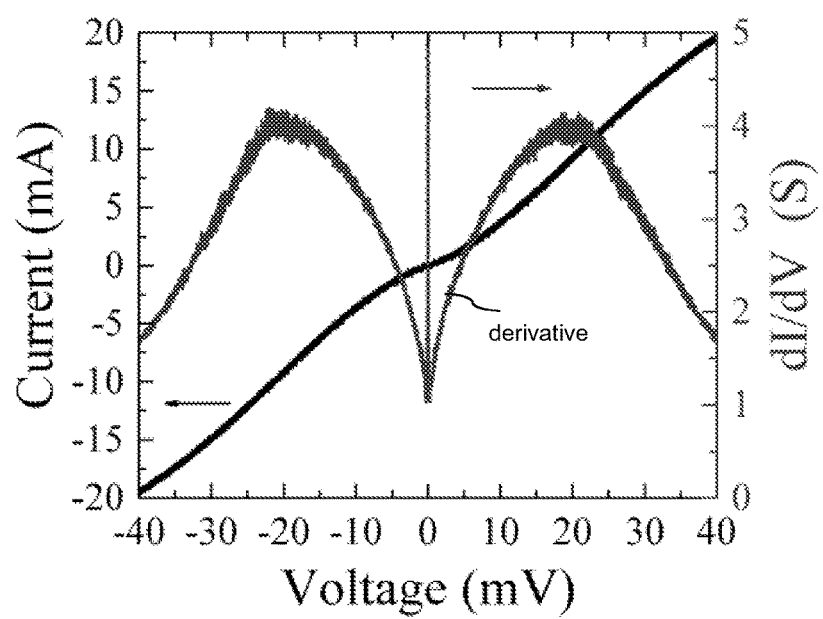
FIG. 13 shows the I-V characteristics for the SIS SQUID measured for a larger voltage range and its derivative, showing an energy gap-like feature at ~20 mV.

The I-V for the SIS SQUID measured for a much higher voltage range shows non-linear insulator-like characteristics, as shown in FIG. 13. Using a lock-in amplifier, we differentiate the I-V curve—the derivative exhibits a gap-like feature at ~20 mV, similar to the earlier results on SIS YBCO junctions (33 mV). The different value may be due to the different material used in this example.

Figure 14A:
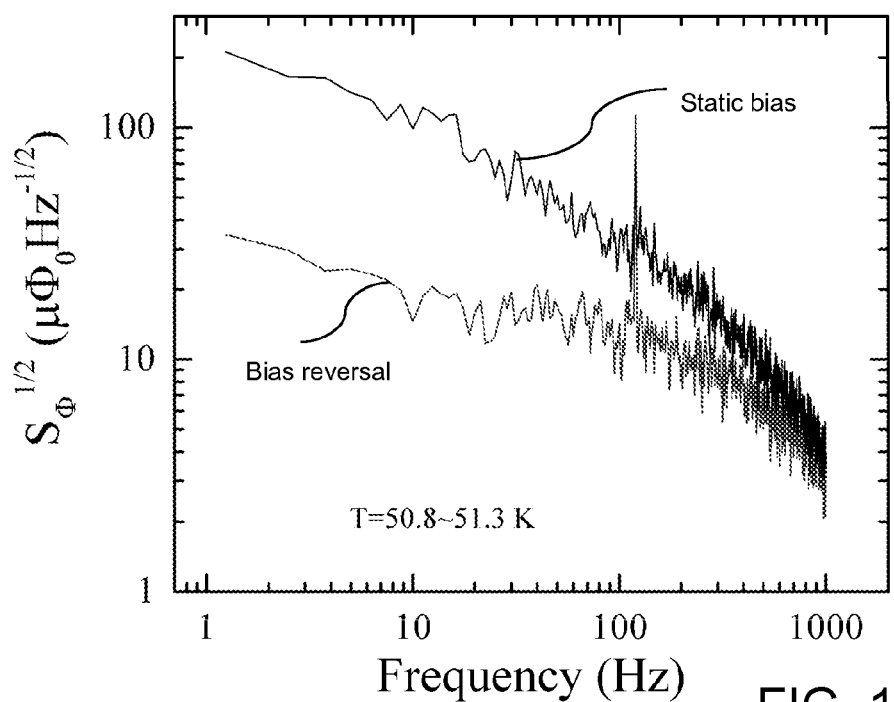
FIGS. 14A and 14B are SNS DC SQUID noise spectra measured at 50K for 2 kHz and 200 Hz ranges, respectively.
Figure 14B:
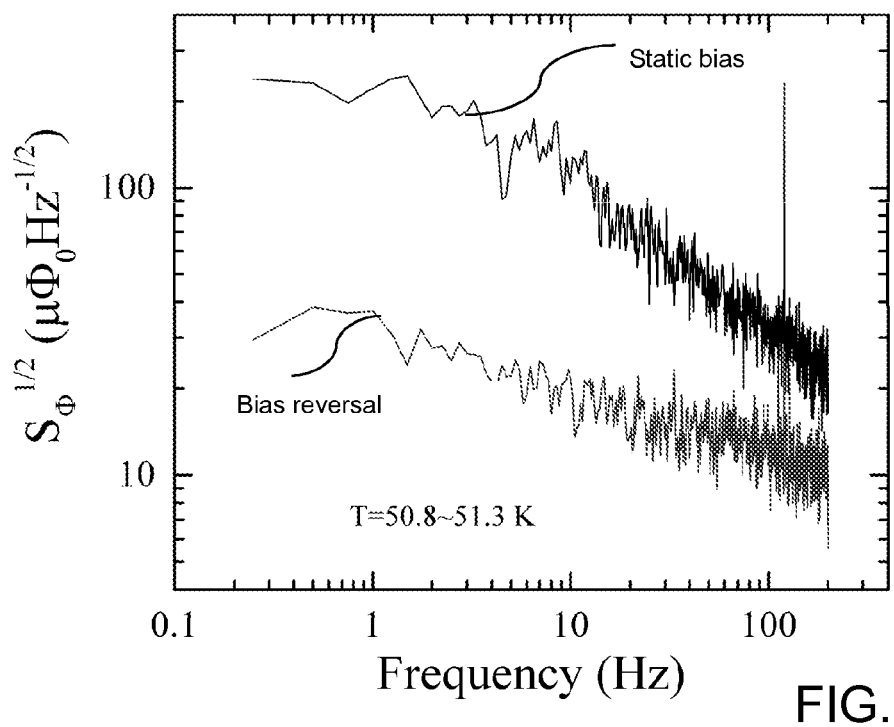

Noise spectra as measured by connecting the SNS SQUID to a Tristan Technologies iMAG 300®-series flux-locked loop output to a signal analyzer. The results are shown in FIGS. 14A and 14B with and without bias reversal to reduce the critical current noise. As shown in FIG. 14A, the 1/f knee occurs around 1 kHz, while the white noise level is about $2\mu\Phi_0/Hz^{-1/2}$. For low frequencies, the noise of the SQUID is about $20\mu\Phi_0/Hz^{-1/2}$ at 10 Hz, which corresponds to a filed noise of 20 pTHz$^{-1/2}$. This value can be substantially improved by using a larger-sized washer or incorporating the SQUID into a multi-turn flux transformer.

Using the inventive method to directly pattern the SQUID should not only increase HTS sensor yields, but also reduce inter-sensor variability in terms of noise, phase delay, and critical current. With these improvements, the financial obstacle to HTS large channel count arrays can be removed, due mainly to the 100 fold reduction in sensor fabrication labor. Decreasing the sensor costs would make high channel count systems more economical than conventional niobium SQUID systems due to the simplified cryogenics.

Example 6: Nanowire Patterning

Direct write ion lithography using a focused helium beam was used to pattern nanowires as small as about 200 nm within the plane of a high-temperature superconducting (HTS) film.

Test samples were prepared by patterning 4 μm wires with standard photolithography and broad beam ion etching from 30 nm thick YBCO films grown on sapphire. The thickness was selected based on Monte Carlo simulations run using available simulations, e.g., ATHENA™ process simulation software from Silvaco, which indicated that 30 keV helium ions will completely penetrate the film and implant into the substrate.

FIGS. 15A-15D illustrate selected results of the simulations of varying dose-energy pairs for 250 nm thick YBCO film. As shown in FIG. 15A, $10\times10^{16}$ ions at 10 keV was too low energy to penetrate the material—a large lateral straggle occurred. At a dose of $10\times10^{16}$ ions, an energy of 55 keV was enough to fully penetrate the material, however, lateral straggle still remains, as shown in FIG. 15B. FIG. 15C shows the results for $7\times10^{16}$ ions and 150 keV, where the dose is too low, resulting in a low density of damage. The relatively high dose of $19\times10^{16}$ ions and 150 keV produces a uniform thin barrier, shown in FIG. 15D, which is likely to give rise to a functional junction.

This ensures a uniform disordered region throughout the superconducting film thickness. Nanowires were made by irradiating insulating barriers to narrow down the 4 μm wires as shown in FIG. 16. In order to precisely determine the wire width, a Josephson junction was added into the center of the nanowire. Measurement of the junction parameters—maximum super current ($I_C$) and voltage state resistance ($R_N$) allows the accurate determination of wire width. To pattern the same, a dose of $6 \times 10^{16}$ He$^+$/cm$^2$ was used to write a Josephson junction in the circuit. The dose was then increased to $2 \times 10^{17}$ He$^+$/cm$^2$ to write the insulating barriers that define the nanowire. Two test samples were made with wire widths of 250 nm and 500 nm, and a third control sample was make without narrowing the wire.

Figure 17A:
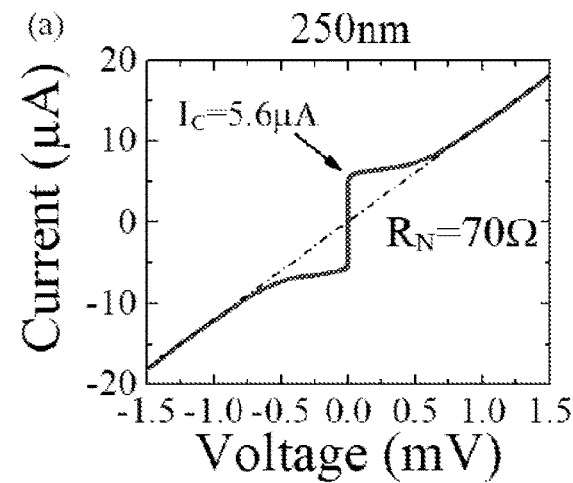
FIGS. 17A-17C show the current-voltage characteristics of YBCO Josephson junctions with wire widths of 250 nm, 500 nm and 4 μm, respectively.
Figure 17B:
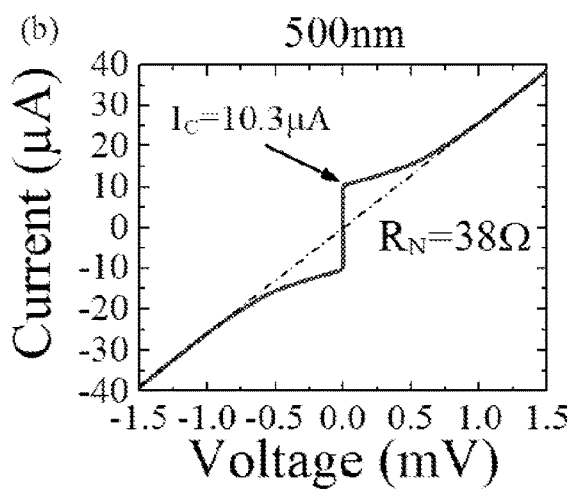
Figure 17C:
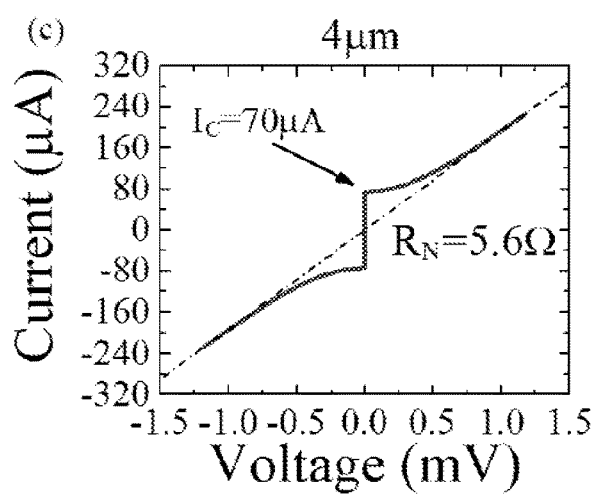

Current-voltage characteristics of the samples were measured in a vacuum cryostat inside of a liquid helium Dewar at 4.6 K. FIGS. 17A-17C show the results for 250 nm, 500 nm and 4 μm wide wires, respectively. All of the junctions have an $I_C R_N$ product of about 400 μV, as expected, because the $I_C R_N$ product should be a constant of the material. This suggests that material properties in the wire remained the same and that there was no thermal damage. Further, $R_N$ values are 70 Ω, 38Ω and 5.6Ω, respectively, which scale inverse proportionally with the width $$\left(\frac{1}{R_N} \propto w\right).$$

$I_C$ values for the junctions are 5.6, 10.3, and 70 μA, respectively, which scale proportionally with the width ($I_C \propto w$). These results demonstrate that current only flows through the nano filament as intended, and that functioning nanowires were, in fact, created using direct writing with a focused He ion beam. Using the inventive patterning method, nanowires may be created with widths ranging from 250 nm on up to the micron scale dimensions that are easily attained using conventional photolithographic and other known direct writing methods.

Figure 17D:
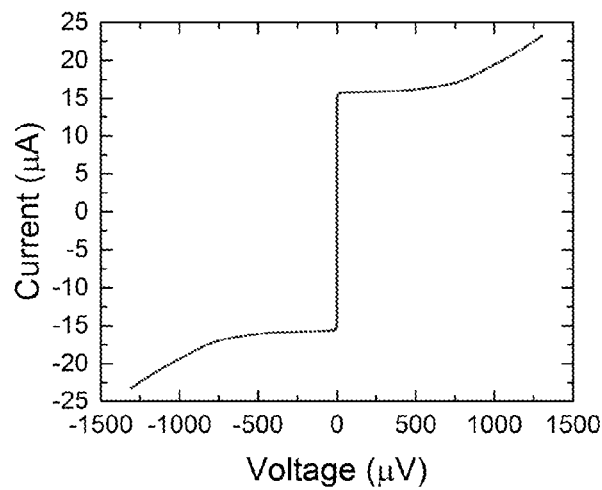
FIG. 17D shows the current-voltage characteristics for a 200 nm nanowire junction.

Additional experiments produced nanowires with widths of about 200 nm with a junction inserted inside. FIG. 17D shows the test results for the nanowire junction, indicating a very high $I_C R_N$, on the order of 1.1 mV. This clearly demonstrates that the inventive process is capable of producing junctions with performance characteristics to rival those of more conventional, lower $T_C$ materials.

Example 7: In Plane Anisotropy

As is known in the art, cuprate superconductors exhibit d-wave symmetry—with four lobes having alternating phases. Thus, in superconductors with a d-wave order parameter symmetry, there is not the well-defined isotropic energy gap that exists in conventional superconductors. Rather, there are directions of zero gap. The presence of these states results in a tunnel junction current-voltage characteristic that is very different from those of conventional superconductors. In addition, $I_C R_N$ of d-wave junctions do not appear to obey the Ambegaeokar-Baratoff relation $I_C R_N = \pi \Delta / 2e \tan h(\Delta 2_{k_B T})$ that relates $V_C$ to the gap energy $\Delta$. Typical observed values for $I_C R_N$ are <~1000 μV, which differs from the predicted values by an order of magnitude. The nature of the d-wave symmetry order parameter of HTS suggests that the tunneling properties depend heavily on the orientation of the junction, provided that the films are single crystal.

Figure 18:
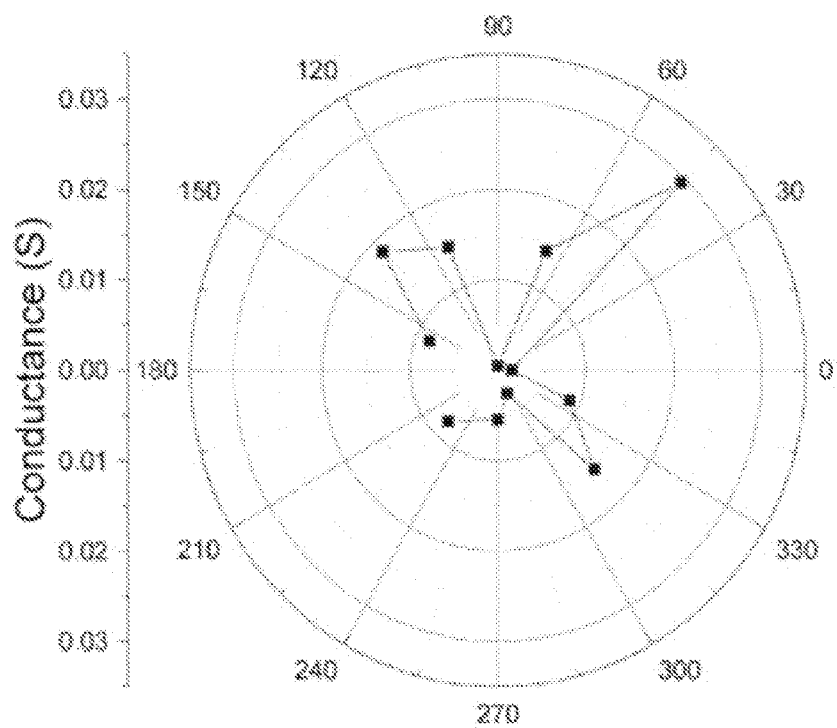
FIG. 18 is a polar plot of conductance demonstrating anisotropy of YBCO in the a-b plane.

To test this, tunnel barriers were patterned with different orientations in the a-b plane. The junctions were created in 250 nm nanowires patterned as described in Example 6 above. This allowed the wires to be closely spaced together to improve the possibility that the device was located on a single grain. The I-V characteristics were measured for the devices. The conductance is shown on the polar plot in FIG. 18. The plot clearly demonstrates the anisotropy of YBCO in the a-b plane.

The pattern shown in FIG. 19 was used to further test this observation. Junctions of different widths were formed at 0°, 45°, 90°, 135°, 180°, 225°, 270°, and 315°, using the layout shown. (The inset shows the d-wave order parameter.) FIGS. 20A-20D are polar plots of the results for junction widths of 250 nm, 1 μm, 2 μm and 4 μm, respectively. $I_C R_N$ varies from 50 μV to 5.5 mV.

It has been observed that while typical LTS niobium circuits exhibit standard deviations in junction parameters below 5%, the standard deviations for Josephson circuits using HTS materials are generally between 10-30%. Without wishing to be bound by theory, it is believed that this in-plane anisotropy may be the cause of the large $I_C R_N$ spreads in all HTS junctions. The ability to control the anisotropy is, therefore, a key to achieving small spreads and maximizing $I_C R_N$ for HTS Josephson digital applications.

Example 8: Direct-Write Patterning of Other Superconductors

Figure 21:
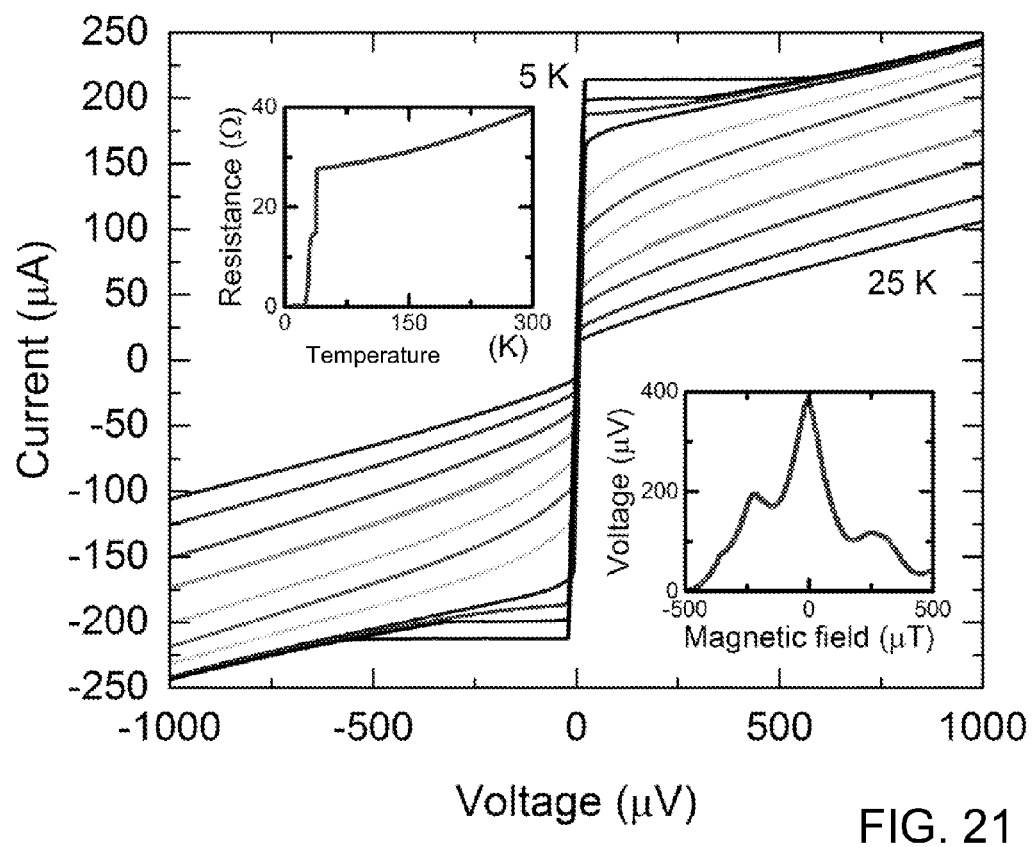
FIG. 21 shows the current-voltage characteristics for a SQUID device fabricated in magnesium diboride using the inventive method; insets show resistance versus temperature and voltage versus magnetic field.

While the exemplary embodiments described have dealt primarily with YBCO Josephson circuits, the inventive direct-write approach is similarly applicable to metal superconductors such as $MgB_2$. Using the process as described in the preceding examples, a 150 nm magnesium diboride thin film, formed by reactive evaporation on a sapphire substrate (Moeckley and Ruby, *Supercon. Sci. Technol.* 19 (2006) L21-L24), was argon ion milled down to about 20-50 nm then patterned using a focused helium ion beam to form SQUIDs. While the same general processing parameters were used, due to the difference in materials, the dose required to produce the desired damage without lateral straggle, was much higher that used for the YBCO films—on the order 3000 ions/nm. Using the testing procedures described above, the I-V characteristics of the devices were measured. The results, shown in FIG. 21, indicate that it is possible to obtain high resistance ~10Ω $MgB_2$ junctions using the inventive method. The upper left inset in FIG. 21 shows the resistance with temperature. The lower right inset provides the measured voltage with magnetic field.

Figure 22:
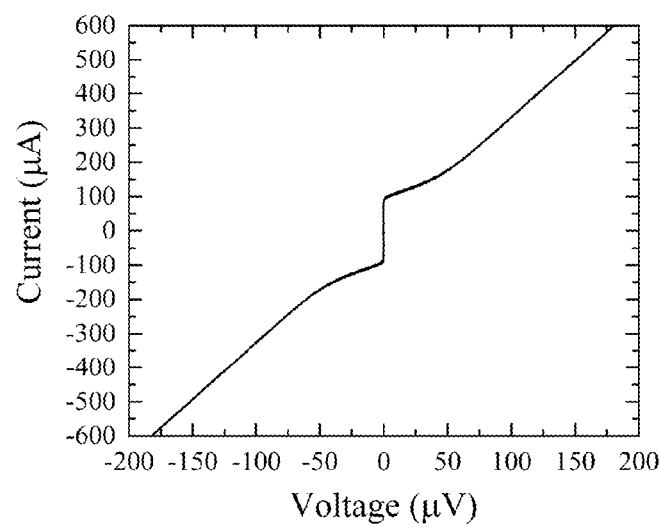
FIG. 22 shows the current-voltage characteristics for a junction formed in an iron pnictide superconductor according to an embodiment of the invention.

Using the inventive process, a junction was fabricated in an iron pnictide superconductor. A thin film of epitaxial $Ba(Fe_{1-x}Co_x)_2 As_2$ grown on a substrate by pulsed laser deposition (Q Y Lei et al., 2014 *Supercond. Sci. Technol.* 27(11)) was patterned to form junctions using the procedures described above. The initial film thickness was around 30-60 nm. I-V characteristics measured at 9.2 K are provided in FIG. 22.

Example 9: Josephson Junctions with Temperature-Independent Resistance

Figure 23:
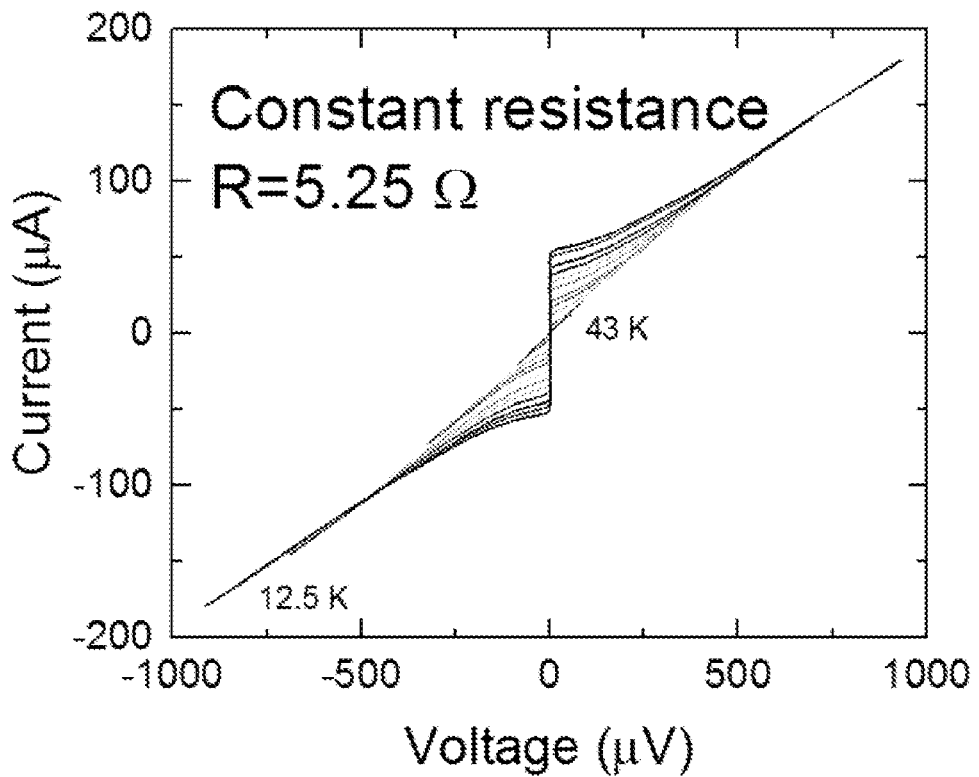
FIG. 23 plots the current-voltage characteristics for a junction formed in YBCO using the inventive process, demonstrating temperature-independent resistance.

In addition to providing for improved control over electrical properties, the inventive direct-write method provides a number of other important advantages. In one application of the inventive technique, selection of a dose in between the metal insulator transition creates junctions with a temperature independent resistance, which would be very desirable for applications that may be sensitive to thermal fluctuations, such as antennas. Such devices would always maintain a constant impedance for matching to other electronics. An YBCO film processed using the inventive method with a helium ion beam dose of 325 ions/nm produced in a 5.25Ω junction resistance that does not change between 12 and 45 K, as shown in FIG. 23.

Figure 24:
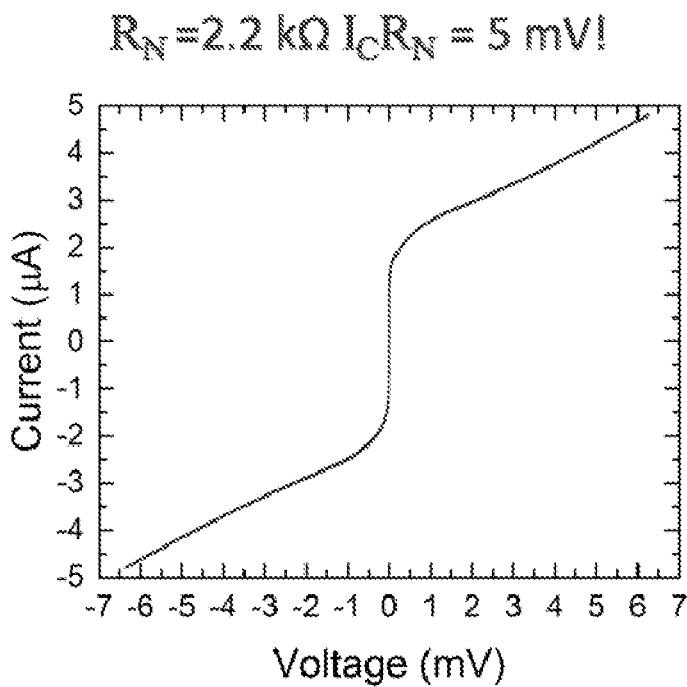
FIG. 24 plots the current-voltage characteristics for a high impedance junction formed in YBCO using the inventive process.

Unlike many prior art approaches to creating Josephson junctions, the inventive direct write single layer process makes it possible to orient Josephson barriers and currents in any direction, easily tune $I_C R_N$, up to very high values (>mV) (see, e.g., FIG. 24, showing results for a high impedance junction with $I_C R_N$ of 5 mV) by dose and barrier length, create resistors, insulators, capacitors and inductors in the same material, and create flux pinning structures in the electrodes to lower noise. The high degree of control means that the inventive process can be used to produce devices with resistances (~kΩ) that are high enough to impedance match single junctions to room temperature electronics.

The procedures described above, and the devices made therefrom, will have a significant and far reaching impact for applications of superconducting electronics covering a wide spectrum, ranging from highly sensitive magnetometers for biomagnetic measurements of the human body, to large scale arrays for wideband satellite communications.

Applications of the inventive superconducting devices to biomedical imaging include magnetoencephalography (MEG), for temporal imaging of electromagnetic signals in the brain for neurological study. Current systems rely on liquid helium cooled niobium, which is costly and limits access. Advantages provided by the inventive technology include the ability to position a high $T_C$ sensor closer to the head. The sensors are smaller and less expensive and greater resolution can be obtained with nanosensor arrays. Another medical imaging technique that can be greatly improved by exploiting the inventive technology is magnetocardiography (MCG), magnetic imaging of the heart to non-invasively detect blockages. Systems based on high-$T_C$ could be made and operated at lower cost, and could be made portable due to the relaxed cooling constraints. Systems for performing liver susceptometry, which measures iron levels in the liver, could similarly be manufactured and operated less expensively as well as being incorporated into a portable form by removing the limitations imposed by reliance on lower $T_C$ superconducting devices.

All manner of rapid single flux quantum (RSFQ) computing that rely on Josephson junctions can be greatly improved using the inventive technology, as can communications systems such as wide-bandwidth receive antennas and direction finding antennas.

Other magnetometer applications that will benefit from the inclusion of devices made using the inventive process include, but are not limited to geological surveying for detection of underground deposits of oil, precious metals, etc., non-destructive evaluation to detect weaknesses and faults in structures such as bridges, airplanes, buildings, etc., and magnetic microscopy for evaluation of semiconductor circuitry.

For basic science, the processes described herein will contribute to unraveling the mysteries of unconventional superconductors and could play a major role in new technologies such as quantum information science. Furthermore, the method of direct patterning thin films is not just limited to YBCO. This technique will be applicable to other superconducting materials including magnesium diboride (MgB$_2$), TlBCCO 128 K, iron pnictides (Fe—As), as well as other materials that are sensitive to disorder, such as multiferroics, graphene, manganites and semiconductors.

The patterning approaches utilized herein is also applicable to other oxides including oxide semiconductors, ferromagnets (CMR), Li-Ion battery cathodes, ferroelectrics, anti-ferromagnets, high-k dielectrics, high mobility 2D electron gases, multiferroics, and thermoelectrics.

Embodiments of the inventive subject matter may be referred to herein, individually and/or collectively, by the term "invention" merely for convenience and without intending to limit the scope of this application to any single invention or inventive concept. Thus, although specific embodiments and examples have been illustrated and described herein, it should be appreciated that any arrangement calculated to achieve the same purpose may be substituted for the specific embodiments shown. This disclosure is intended to cover any and all adaptations or variations of various embodiments. Combinations of any of the above-described embodiments and examples, and other embodiments not specifically described herein, may be used and are fully contemplated herein.

The invention claimed is:

1. A method for fabricating a superconducting device, comprising:
   patterning a circuit pattern comprising planar bridges in a superconducting film;
   patterning a conductive metal to define a plurality of electrodes within the circuit pattern; and
   direct writing with a focused ion energy beam having an energy level and a beam diameter onto selected regions of the planar bridges to define a barrier for forming a Josephson junction having a width on the order of, or less than, a coherence length of the superconducting film;
   wherein the superconducting film has a predetermined film thickness selected so that the energy beam travels and induces damage through the entire predetermined film thickness without the beam diameter substantially increasing as a result of damage collisions.

2. The method of claim 1, wherein the superconducting film is selected from the group consisting of YBCO, magnesium diboride (MgB2), iron pnictides, and TlBCCO.

3. The method of claim 1, wherein the ion energy beam is a helium ion beam having an energy level of 30 kV and the film thickness is 30 nm or less.

4. The method of claim 1, wherein the ion energy beam is an ion beam selected from the group consisting of helium ion, silicon ion and beryllium ion.

5. The method of claim 1, wherein the ion energy beam has ion fluences within a range of $10^{14}$ and $10^{18}$ ions/cm$^2$.

6. The method of claim 1, wherein the beam diameter is about 500 pm.

7. The method of claim 1, wherein the circuit pattern is formed on a substrate, and further comprising applying a negative bias to the substrate so that the energy level is greater than 30 kV and the film thickness is greater than 30 nm.

8. The method of claim 1, wherein the superconducting film has an initial thickness, and further comprising, prior to the step of direct writing with the focused ion energy beam, ion milling the superconducting film to reduce the initial thickness to the predetermined film thickness.

9. The method of claim 1, wherein the step of patterning a circuit pattern comprises directing the focused ion energy beam onto edges of the plurality of bridges to damage the edges to improve bridge width uniformity.

10. The method of claim 1, wherein the Josephson junction has a width on the order of 1 nm.

11. A nanoscale superconducting device, comprising:
a circuit pattern comprising a plurality of planar bridges defined in a superconducting film and having non-superconducting Josephson junctions formed therein, wherein the superconducting film has a film thickness adapted to permit an irradiating focused ion energy beam used to direct write the Josephson junctions to travel through the entire film thickness without the diameter of the energy beam substantially increasing as a result of damage collisions, and wherein the Josephson junctions have widths on the order of, or less than, a coherence length of the superconducting film.

12. The superconducting device of claim 11, wherein the superconducting material is selected from the group consisting of YBCO, magnesium diboride ($MgB_2$), iron pnictides, and TlBCCO.

13. A SQUID device comprising an array of superconducting devices as claimed in claim 11.

14. A method for forming a nanoscale electronic device in a film of material sensitive to disorder, comprising:
direct writing onto a bridge area of a planar circuit pattern defined in the film with a focused ion energy beam having a beam diameter and an energy level adapted to induce ion damage and penetrate through a predetermined film thickness without substantial lateral straggle to define a tunnel barrier having a width on the order of, or less than, a superconducting coherence length of the material.

15. The method of claim 14, wherein the material is selected from the group consisting of superconductors, multiferroics, graphene, manganites and semiconductors.

16. The method of claim 14, wherein the material is a superconductor selected from the group consisting of YBCO, magnesium diboride ($MgB_2$), iron pnictides, and TlBCCO.

17. The method of claim 14, wherein the focused ion energy beam is an ion beam selected from the group consisting of helium ion, silicon ion and beryllium ion.

18. The method of claim 14, wherein the ion energy beam has an energy level within a range of 30 kV to 200 kV.

19. The method of claim 14, wherein the beam diameter is about 500 pm.

20. The method of claim 14, wherein the circuit pattern is formed on a substrate, and further comprising applying a negative bias to the substrate.

21. The method of claim 14, wherein the film has an initial thickness, and further comprising, prior to the step of irradiating, ion milling the film to reduce the initial thickness to the predetermined film thickness.

22. The method of claim 14, wherein the tunnel barrier has a width on the order of 1 nm.

23. The method of claim 14, wherein the nanoscale device is one or more nanowires.

* * * * *